(12) United States Patent
Kato et al.

(10) Patent No.: US 6,239,958 B1
(45) Date of Patent: *May 29, 2001

(54) ELECTROSTATIC DAMAGE PROTECTION CIRCUIT AND DYNAMIC RANDOM ACCESS MEMORY

(75) Inventors: Katsuhiro Kato; Yasuhiro Fukuda, both of Tokyo (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/215,146

(22) Filed: Dec. 18, 1998

(30) Foreign Application Priority Data

Dec. 22, 1997 (JP) .................................................. 9-353312

(51) Int. Cl.[7] ........................................................ H02H 9/00
(52) U.S. Cl. ................................................................ 361/56
(58) Field of Search .................................. 327/310, 313, 327/552, 553, 551, 594; 361/56, 111, 91.1, 91.5

(56) References Cited

U.S. PATENT DOCUMENTS

| | | | | |
|---|---|---|---|---|
| 4,855,620 | * | 8/1989 | Duvvury et al. | 361/91 |
| 5,214,562 | * | 5/1993 | Levi | 361/56 |
| 5,499,152 | * | 3/1996 | Tamakoshi | 361/56 |
| 5,644,459 | * | 7/1997 | Lien | 361/56 |
| 5,729,419 | * | 3/1998 | Lien | 361/111 |
| 5,910,874 | * | 6/1999 | Iniewski et al. | 361/56 |

* cited by examiner

Primary Examiner—Ronald W. Leja
(74) Attorney, Agent, or Firm—Venable; Robert J. Frank; Allen Wood

(57) ABSTRACT

When a semiconductor integrated device is in an inactive state without being supplied with electric power, depletion type NMOS transistors act as resistors whereby a signal line connected to an input pad is electrically connected to the sources of input transistors via the NMOS transistors. In this situation, if an electrostatic surge is applied to the input pad, the surge is released to a voltage supply line. This ensures that the semiconductor integrated device is prevented from being damaged by the electrostatic surge. When electric power is supplied to the semiconductor integrated device and it becomes active, the NMOS transistors come to behave as insulating elements and thus these NMOS transistors have no adverse effects on the normal operation of the semiconductor integrated device.

22 Claims, 16 Drawing Sheets

ELECTROSTATIC DAMAGE PROTECTION CIRCUIT AND DYNAMIC RANDOM ACCESS MEMORY

BACKGROUND OF THE INVENTION

1. Field of the Invention

The present invention relates to an electrostatic damage protection circuit (hereinafter referred to simply as a protection circuit) provided in a semiconductor integrated device to prevent electrostatic damage, and also to a dynamic random access memory (hereinafter referred to as a DRAM).

2. Description of the Related Art

In the recent semiconductor integrated device technology, CMOS ICs (Complementary Metal Oxide semiconductor Integrated Circuits) are most widely used because of their advantage of being capable of operating with low power and achieving a high integration density. MOS transistors used in CMOS ICs have a structure consisting of a thin gate oxide film formed on a semiconductor substrate, a gate electrode formed on the gate oxide film, and source and drain electrodes wherein the gate electrode and source and drain electrodes are isolated from one another by the gate oxide film. The disadvantage arising from such a structure and thus essential to the CMOS IC is that the gate oxide film is easily damaged by an external electrostatic surge. To ease this problem, all terminals, no matter whether they are input terminals or output terminals, are protected by protection circuits.

FIG. 2 illustrates a conventional protection circuit for protecting input terminals, and FIG. 3 illustrates a conventional protection circuit for protecting output terminals.

The input terminal protection circuit includes a p-channel MOS transistor (hereinafter referred to as a PMOS transistor) 1 whose gate and source are connected to a power supply line Lv for supplying a voltage VDD so that the PMOS transistor 1 is fixed to an off-state, and an n-channel MOS transistor (hereinafter referred to as an NMOS transistor) 2 whose gate and source are connected to a ground line Lg for supplying a ground voltage GND so that the NMOS transistor 2 is also fixed to an off-state. An input pad Pi serving as an input terminal is connected to the drains of the PMOS transistor 1 and the NMOS transistor 2. The input pad Pi connected to the drains of the PMOS transistor 1 and the NMOS transistor 2 is also connected via a gate protection resistor 3 to the gates of transistors 4a and 4b of an internal circuit 4 to be protected.

In this input terminal protection circuit of the widely used type, if an electrostatic surge is input to the input pad Pi, the resistor 3 produces a delay in the surge voltage applied to the gates of the internal circuit 4 to be protected, and the PMOS transistor 1 and the NMOS transistor 2 absorb the electrostatic surge into the power supply line Lv and the ground line Lg.

On the other hand, the output terminal protection circuit includes a PMOS transistor 5 whose gate and source are connected to a power supply line Lv for supplying a voltage VDD so that the PMOS transistor 5 is fixed to an off-state, and an NMOS transistor 6 whose gate and source are connected to a ground line Lg for supplying a ground voltage GND so that the NMOS transistor 6 is also fixed to an off-state. An output pad Po serving as an output terminal is connected to the drains of the PMOS transistor 5 and the NMOS transistor 6. The output node N of an internal circuit 7 to be protected is connected to an output transistor 7a which turns on and off between the node N and the power supply voltage VDD and also to an output transistor 7b which turns on and off between the node N and the ground voltage GND, wherein the output node N is also connected the drains of the PMOS transistor 5 and the NMOS transistor 6.

In the output terminal protection circuit of this type, an electrostatic surge entering the circuit via the output pad Po toward the node N is shunted by the PMOS transistor 5 and the NMOS transistor 6 thereby enhancing the resistance of the internal circuit 7 against the electrostatic damage.

With the advancement in the microfabrication technology, it is becoming possible to produce smaller-sized element devices. However, it is becoming more difficult to effectively protect CMOS ICs including such small sized devices from electrostatic damage by conventional protection circuits. The operation of the conventional protection circuit is described below, and problems in the conventional protection circuit are discussed.

If an electrostatic surge enters the circuit via the input pad Pi, a breakdown occurs between the substrate and the drain of the PMOS transistor 1 or the NMOS transistor 2, and a parasitic PNP or NPN transistor associated with the PMOS transistor 1 or the NMOS transistor 2 turns on. As a result, the surge current is absorbed as a bipolar current into the power supply line Lv or the ground line Lg. This means that only when the drain voltage reaches a breakdown voltage, the PMOS transistor 1 and the NMOS transistor 2 can provide their protective function. In most transistors except for special transistors designed for dedicated use as protective transistors and high-voltage transistors, the impurity diffused into the drain and source regions slightly penetrates into a region under the gate. As a result, an end portion of the gate overlaps the drain impurity diffusion layer via the gate oxide film. Therefore, in the conventional protection circuit, the part of the gate oxide film sandwiched between the drain impurity diffusion layer and the gate is subjected to the stress of a voltage equal to the breakdown voltage until the breakdown occurs.

To prevent the end portion of the gate oxide film of such a transistor structure from being damaged, it is required that a breakdown should occur at the drain before the gate oxide film is damaged. In other words, it is required that the thickness of the gate oxide film should be selected to be thick enough that the intrinsic breakdown voltage of the gate oxide film becomes higher than the breakdown voltage of the drain. The input terminal protection circuit is provided to protect the gates of transistors of the internal circuit 4. To this end, the input terminal protection circuit is constructed with the PMOS transistor 1, the NMOS transistor 2, and the resistor 3 so that a surge voltage is delayed by the resistor 3 thereby allowing the surge voltage to be shunted into the power supply line Lv and the ground line Lg.

When the thickness of the gate oxide film is reduced, the resistance of the resistor 3 should be increased to a sufficiently high value to protect the thin oxide film. However, the increase in the resistance also causes the gate signal to be delayed during the normal operation, and thus the requirement of high-speed operation cannot be met. Also in the output terminal protection circuit, the damage of the gate oxide film at an end of the gate of the MOS transistor 7a or 7b of the internal circuit 7 or the PMOS protection transistor 5 or the NMOS protection transistor 6 is a serious problem.

The gate oxide film becomes thinner with the reduction in the size of transistors. This results in a reduction in the difference between the intrinsic breakdown voltage of the gate oxide film and the breakdown voltage of the drain. That is, in recent semiconductor integrated devices, because of the very small difference between the breakdown voltage of the drain and the intrinsic breakdown voltage of the gate oxide film, the gate oxide film is often damaged when a voltage close to the intrinsic breakdown voltage is applied across the gate oxide film. Even when the gate oxide film is not damaged, such a surge current can cause carriers to be injected into the gate oxide film, thus causing degradation in the characteristics of the PMOS transistor 1 or the NMOS transistor 2. As described above, in the conventional technique in which the PMOS transistor 1 and the NMOS transistor 2 are forced into breakdown and then bipolar currents are absorbed into the power supply line Lv and the ground line Lg, it is required that the drain breakdown voltage should be lower than the intrinsic breakdown voltage of the gate oxide film. Because of this requirement, it is substantially impossible to employ a thin oxide film having an intrinsic breakdown voltage lower than the drain breakdown voltage. If it were possible to employ a thin gate oxide film regardless of the drain breakdown voltage, the resulting great advantage would be that it becomes possible to achieve a great improvement in the performance, such as the response speed and current driving capability, of semiconductor integrated devices. Another advantage is that the degree of freedom in setting the production process parameters increases drastically.

Recent semiconductor integrated devices include a great number of outputs. However, the width of power supply lines cannot be increased to a sufficient degree corresponding to the great number of outputs. Thus, when switching occurs simultaneous at a plurality of output terminals, a reduction in the power supply voltage VDD occurs, which can cause a logical circuit in the internal circuit 7 to operate erroneously. Furthermore, switching noise generated in a digital circuit causes a fluctuation in the power supply voltage VDD, which in turn affects the input or output level of an analog circuit. To prevent such a problem, the power supply line for the output transistors at the final stage is generally provided separately from the power supply line for the other circuits in the internal circuit 7 or the power supply line for the digital circuit is provided separately from the power supply line for the analog circuit wherein the respective power supply lines are connected to external connection terminals via bonded gold wires. FIG. 4 illustrates an example of an input/output protection circuit for use in a semiconductor integrated device with a plurality of power supplies.

In FIG. 4, illustrating the conventional input/output protection circuit, elements similar to those in FIG. 2 or 3 are denoted by similar reference numerals or symbols.

This protection circuit is provided between an input/output pad Pio and an internal circuit including an input stage and an output stage wherein the input stage includes input transistors 4a and 4b connected in series between a power supply terminal Ti1 for the input stage and a ground terminal Ti2 for the input stage, and the output stage includes output transistors 7a and 7b connected in series between a power supply terminal To1 for the output stage and a ground terminal To2 for the output stage. The protection circuit includes a PMOS transistor 8 and an NMOS transistor 9 serving as protection transistors. The source and the gate of the PMOS transistor 8 are connected to the power supply terminal To1, and the source and the gate of the NMOS transistor 9 are connected to the ground terminal To2. The drains of the PMOS transistor 8 and the NMOS transistor 9 are connected to the input/output pad Pio.

Furthermore, the input/output pad Pio and the drains of the PMOS transistor 8 and the NMOS transistor 9 are connected to the gates of the input transistors 4a and 4b via a protection resistor 3. The protection circuit also includes a PMOS protection transistor 10 connected between the power supply terminals To1 and Ti1 and also includes an NMOS protection transistor 11 connected between the ground terminals To2 and Ti2. The gate and the source of the PMOS transistor 10 are connected to the power supply terminal Ti1, and the drain of the PMOS transistor 10 is connected to the power supply terminal To1 so that the PMOS transistor 10 is in an off-state during a normal operation. The gate and the source of the NMOS transistor 11 are connected to the power supply terminal Ti2, and the drain of the PMOS transistor 11 is connected to the power supply terminal To2 so that the NMOS transistor 11 is in an off-state during the normal operation.

In the protection circuit shown in FIG. 4, if an electrostatic surge penetrates into a path having no dedicated protection transistor, such as a path from the input pad Pio to the power supply terminal Ti1 or the ground terminal Ti2 for the input stage, the PMOS protection transistor 8 and the NMOS protection transistor 9 first respond such that the surge current is released into the power supply terminal To1 or the ground terminal To2, and subsequently the surge current is further passed through the PMOS transistor 11 connected between the power supply terminals To1 and Ti1, or through the NMOS transistor 12 connected between the ground terminals To2 and Ti2, thereby absorbing the surge current. Because the surge current is absorbed by two stages of protection transistors, inevitable degradation in response to the electrostatic surge occurs. This results in a problem that the resistance of the protection resistor 3 has to be large, or the gate oxide films of the input transistors 4a and 4b will be damaged.

SUMMARY OF THE INVENTION

According to an aspect of the present invention, there is provided an electrostatic damage protection circuit provided in a semiconductor integrated device including an input transistor, the input transistor including: a gate electrode for inputting an input signal from an input terminal via a signal line; a first electrode; and a second electrode to which a first power supply voltage is supplied via a voltage supply line, the input transistor serving to output a signal from the first electrode in response to the input signal when the semiconductor integrated device is active, the electrostatic damage protection circuit comprising: a resistor for delaying the input signal on the signal line; a protection element which is connected between the signal line and the voltage supply line so as to release an electrostatic surge to the voltage supply line; and a first protector connected between the gate electrode and the second electrode of the input transistor, the first protector serving to provide a short-circuited path between the gate electrode and the second electrode when the semiconductor integrated device is inactive before being supplied with electric power, the first protector serving to cut off the path between the gate electrode and the second electrode when the semiconductor integrated device becomes active after being supplied with electric power.

According to another aspect of the present invention, there is provided an electrostatic damage protection circuit provided in a semiconductor integrated device including an output transistor, the output transistor including: a gate electrode; a first electrode connected to a signal line; and a second electrode to which a first power supply voltage is supplied via a voltage supply line, the output transistor serving to output an output signal from the first electrode in response to a signal input to the gate electrode when the semiconductor integrated device is active, the electrostatic damage protection circuit comprising a first protector connected between the first electrode and the gate electrode of the output transistor, the first protector serving to provide a short-circuited path between the gate electrode and the first electrode when the semiconductor integrated device is inactive before being supplied with electric power, the first protector serving to cut off the path between the gate electrode and the first electrode when the semiconductor integrated device becomes active after being supplied with electric power.

Preferably, the electrostatic damage protection circuit further comprises a second protector connected between the gate electrode of the output transistor and the voltage supply line, the second protector serving to provide a short-circuited path between the gate electrode and the voltage supply line when the semiconductor integrated device is inactive before being supplied with electric power, the second protector serving to cut off the path between the gate electrode and the voltage supply line when the semiconductor integrated device becomes active after being supplied with electric power, According to still another aspect of the invention, there is provided an electrostatic damage protection circuit provided in a semiconductor integrated device including an internal circuit connected to a signal line, the electrostatic damage protection circuit comprising at least one protection transistor, the protection transistor including: a gate electrode; a first electrode connected to the signal line; and a second electrode connected to a voltage supply line for supplying a first power supply voltage, the gate electrode being connected such that the electric conduction between the first and second electrodes is cut off during a normal operation, the protection transistor serving, when an electrostatic surge is applied to the signal line, to pass the electrostatic surge to the voltage supply line, the electrostatic damage protection circuit further comprising a third protector connected between the gate electrode and the first electrode of the protection transistor, the third protector serving to provide a short-circuited path between the gate electrode and the first electrode when the semiconductor integrated device is inactive before being supplied with electric power, the first protector serving to cut off the path between the gate electrode and the first electrode when the semiconductor integrated device becomes active after being supplied with electric power.

Preferably, this electrostatic damage protection circuit further comprises a fourth protector connected between the gate electrode of the protection transistor and the voltage supply line, the fourth protector serving to provide a short-circuited path between the gate electrode and the voltage supply line when the semiconductor integrated device is inactive before being supplied with electric power, the second protector serving to cut off the path between the gate electrode and the voltage supply line when the semiconductor integrated device becomes active after being supplied with electric power.

The electrostatic damage protection circuit may further comprise a resistor connected between the gate electrode of the protection transistor and the voltage supply line, wherein when the resistance of the resistor is denoted by R1, the resistance of the short-circuited path provided by the third protector is denoted by R2, and the resistance of the short-circuited path provided by the fourth protector is denoted by R3, the resistances R1, R2, and R3 are set such that the combined resistance of R1 and R3 is equal to or greater than one fourth the resistance R2.

According to still another aspect of the invention, there is provided an electrostatic damage protection circuit provided in a semiconductor integrated device, the semiconductor integrated device including: an internal circuit including an internal transistor including a gate electrode and first and second electrodes electrically isolated from the gate electrode by a gate oxide film; a plurality of power supply terminals for separately inputting the same first power supply voltage; and a plurality of voltage supply lines for transferring the first power supply voltage given from the respective power supply terminals to the internal circuit, the electrostatic damage protection circuit being adapted to protect the gate oxide film of the internal transistor in the internal circuit from an electrostatic surge applied between the plurality of power supply terminals, the electrostatic damage protection circuit comprising a fifth protector connected between the plurality of voltage supply lines, the fifth protector serving to provide a short-circuited path between the plurality of voltage supply lines when the semiconductor integrated device is inactive before being supplied with electric power, the first protector serving to cut off the path between the plurality of voltage supply lines when the semiconductor integrated device becomes active after being supplied with electric power.

In this electrostatic damage protection circuit, when the plurality of fifth protectors provide short-circuited paths, the plurality of voltage supply lines are connected in parallel to each other via the plurality of fifth protectors.

An electrostatic damage protection circuit provided in a semiconductor integrated device, the semiconductor integrated device including:

an internal circuit including an internal transistor, the internal transistor including a gate electrode and first and second electrodes electrically isolated from the gate electrode by a gate oxide film;

a plurality of power supply terminals for separately inputting the same first power supply voltage;

a plurality of voltage supply lines for transferring the first power supply voltage given from the respective power supply terminals to the internal circuit; and a plurality of protection transistors each connected between the plurality of voltage supply lines, each protection transistor including a gate electrode and first and second electrodes electrically isolated from the gate electrode by a gate oxide film, the first and second electrodes being connected to two of the plurality of voltage supply lines, respectively, the gate electrode being connected to the first or second electrode so that the electric conduction between the first and second electrodes is cut off during a normal operation, the each protection transistor being adapted to become conductive between the first and second electrodes when an electrostatic surge is applied between the first and second electrodes, the electrostatic damage protection circuit serving to protect the gate oxide film of the internal transistor in the internal circuit from an electrostatic surge, the electrostatic damage protection circuit comprising a plurality of sixth protectors each connected between the gate electrode and either the second or first electrode which is not connected to the gate electrode of each protection transistor, each sixth protector serving to provide a short-circuited path between the gate electrode and the second or first electrode which is not connected to the gate electrode when the semiconductor integrated device is inactive before being supplied with electric power, each sixth protector serving to cut off the path between the gate electrode and the second or first electrode which is not connected to the gate electrode when the semiconductor integrated device becomes active after being supplied with electric power.

Preferably, the electrostatic damage protection circuit further comprises a plurality of seventh protectors each connected between the gate electrode and either the first or second electrode which is connected to the gate electrode of each protection transistor, each seventh protector serving to provide a short-circuited path by its self between the gate electrode and the first or second electrode which is connected to the gate electrode when the semiconductor integrated device is inactive before being supplied with electric power, each seventh protector serving to cut off the path between the gate electrode and the first or second electrode which is connected to the gate electrode when the semiconductor integrated device becomes active after being supplied with electric power.

The electrostatic damage protection circuit may further comprise a plurality of resistors each connected between the gate electrode and either the first or second electrode which is connected to the gate electrode of each protection transistor, wherein when the resistance of the resistor is denoted by R1, the resistance of the short-circuited path provided by the sixth protector is denoted by R2, and the resistance of the short-circuited path provided by the seventh protector is denoted by R3, the resistances R1, R2, and R3 are set such that the combined resistance of R1 and R3 is equal to or greater than one fourth the resistance R2.

In the electrostatic damage protection circuit, when the plurality of protection transistors provide short-circuited paths, the plurality of voltage supply lines are connected in parallel to each other via the plurality of protection transistors.

The first, second, third, fourth, fifth, sixth or seventh protector may be realized with an n-channel depletion MOS transistor including third and fourth electrodes and a gate electrode for controlling the conduction between the third and fourth electrodes, wherein the above-described connections are made via the third and fourth electrodes of the n-channel depletion MOS transistor, and when the semiconductor integrated device is active, a second power supply voltage with a negative value is applied to the gate of the n-channel depletion MOS transistor so that the n-channel depletion MOS transistor becomes conductive between the third and fourth electrodes.

Alternatively, the first, second, third, fourth, fifth, sixth or seventh protector may be realized with an n-channel junction field effect transistor including third and fourth electrodes and a gate electrode for controlling the conduction between the third and fourth electrodes, wherein the above-described connections are made via the third and fourth electrodes of the n-channel junction field effect transistor, and when the semiconductor integrated device is active, a second power supply voltage with a negative value is applied to the gate of the n-channel junction field effect transistor so that the n-channel junction field effect transistor becomes conductive between the third and fourth electrodes.

Still alternatively, the first, second, third, fourth, fifth, sixth or seventh protector may be realized with a p-channel depletion MOS transistor including third and fourth electrodes and a gate electrode for controlling the conduction between the third and fourth electrodes, wherein the connections are made via the third and fourth electrodes of the p-channel depletion MOS transistor, and when the semiconductor integrated device is active, a second power supply voltage with a positive value is applied to the gate of the p-channel depletion MOS transistor so that the p-channel depletion MOS transistor becomes conductive between the third and fourth electrodes.

Still alternatively, the first, second, third, fourth, fifth, sixth or seventh protector is realized with a p-channel junction field effect transistor including third and fourth electrodes and a gate electrode for controlling the conduction between the third and fourth electrodes, wherein the above-described connections are made via the third and fourth electrodes of the p-channel junction field effect transistor, and when the semiconductor integrated device is active, a second power supply voltage with a positive value is applied to the gate of the p-channel junction field effect transistor so that the p-channel junction field effect transistor becomes conductive between the third and fourth electrodes.

In the electrostatic damage protection circuit, there may be provided an electrically conductive metal interconnection above the gate of the protection transistor, wherein there are provided contact holes at fixed intervals between the gate electrode and the metal interconnection whereby the gate electrode and the metal interconnection are connected to each other via the contact holes.

In the electrostatic damage protection circuit, the protection transistor preferably includes: a plurality of first electrodes and a plurality of second electrodes formed at predetermined intervals on a substrate, the first electrodes and second electrodes being alternately disposed; a plurality of gate patterns each formed above each space between the first and second electrodes, each gate pattern being located above the corresponding space via the gate oxide film; and a connecting pattern formed with the same material as the plurality of gate patterns, the plurality of gate patterns being connected to one another into a ladder form or into a lattice form.

According to a still another aspect of the invention, there is provided a dynamic random access memory comprising: a plurality of memory cells; an internal circuit which operates with the first power supply voltage so as to get access to the plurality of memory cells; and a substrate voltage generating circuit for generating a substrate voltage serving as the second power supply voltage or a step-up circuit for generating a step-up voltage serving as the second power supply voltage, the dynamic random access memory being characterized in that it includes an electrostatic damage protection circuit according to the invention.

In the electrostatic damage protection circuit according to the first aspect of the invention, as described above, there is provided the protection circuit in which the gate electrode and the second electrode of the input transistor are short-circuited only when the semiconductor integrated device is inactive, thereby ensuring that no voltage is applied across the gate oxide film of the input transistor. According to another aspect of the invention, there is provided the first protector whereby the gate electrode and the first electrode of the output transistor are short-circuited only when the semiconductor integrated device is inactive thereby ensuring that no voltage is applied across the gate oxide film.

According to still another aspect of the invention, there is provided the third protector whereby the gate electrode and the first electrode of the protection transistor are short-circuited only when the semiconductor integrated device is inactive thereby ensuring that no voltage is applied across the gate oxide film of the protection transistor. According to still another aspect of the invention, there is provided the fifth protector whereby a plurality of separate voltage supply lines are short-circuited only when the semiconductor integrated device is inactive. According to still another aspect of the invention, there is provided the sixth protector whereby the gate electrode and the first electrode of the protection transistor connected between a plurality of voltage supply lines are short-circuited only when the semiconductor integrated device is inactive thereby ensuring that no voltage is applied across the gate oxide film of the protection transistor. According to still another aspect of the invention, the voltage difference along the gate electrode of the protection transistor is minimized. Thus, the problems described above are solved.

DESCRIPTION OF THE PREFERRED EMBODIMENTS

First Embodiment

Figure 1:
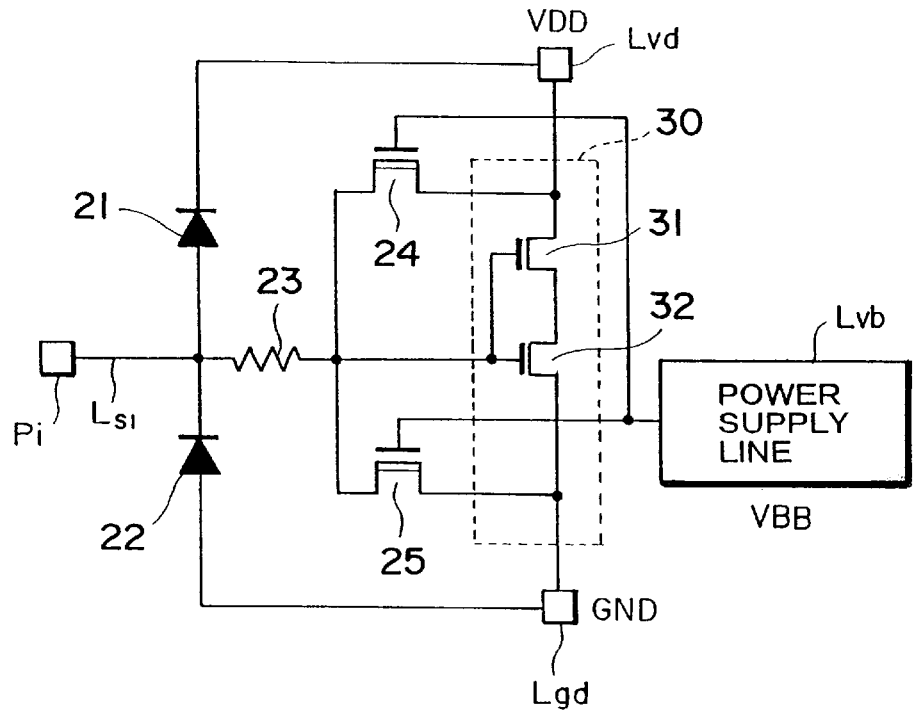
FIG. 1 is a circuit diagram illustrating a first embodiment of a protection circuit according to the present invention.
Figure 2:
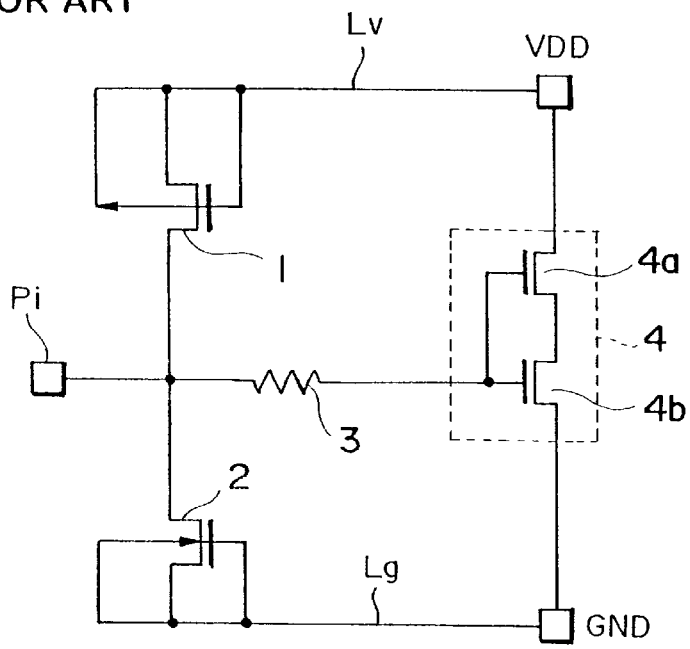
FIG. 2 is a circuit diagram illustrating a conventional input terminal protection circuit.
Figure 3:
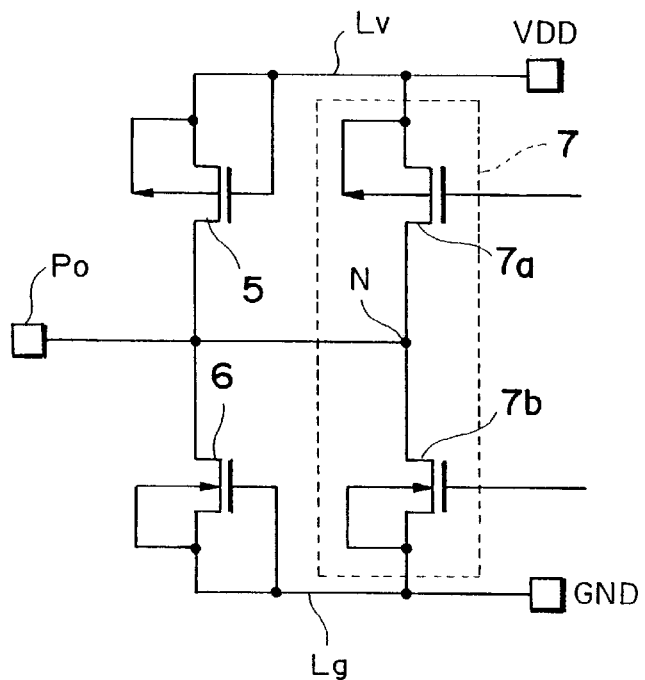
FIG. 3 is a circuit diagram illustrating a conventional output terminal protection circuit.
Figure 4:
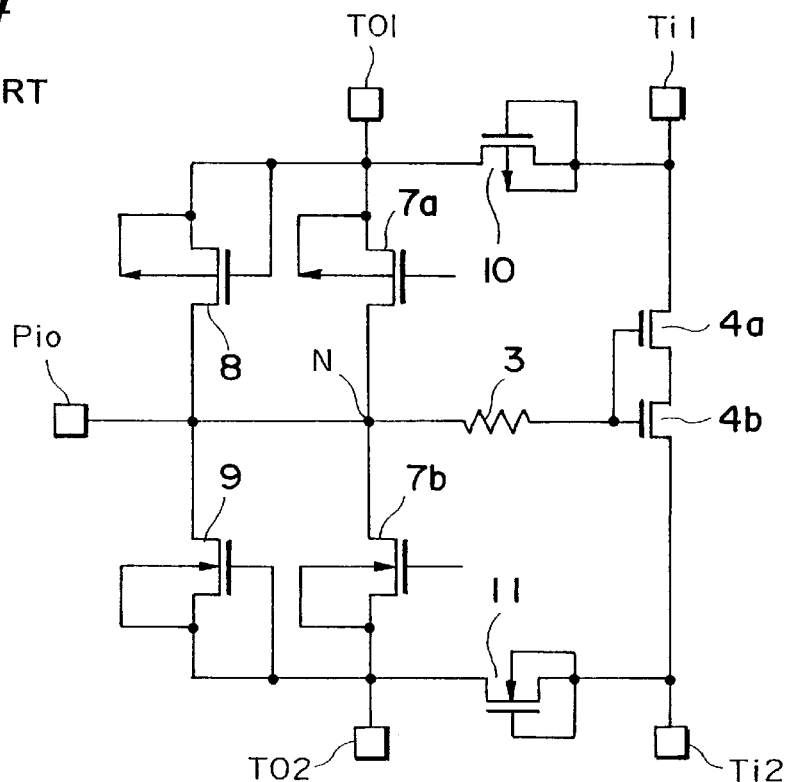
FIG. 4 is a circuit diagram illustrating a conventional input/output protection circuit.

FIG. 1 is a circuit diagram illustrating an first embodiment of a protection circuit according to the present invention.

This protection circuit is provided between an input pad Pi serving as an input terminal of a semiconductor integrated device and the gate of an input transistor of an internal circuit, wherein the protection circuit includes a pn diode 21 serving as a protection device whose anode is connected to a signal line $L_{s1}$ connected to the input pad Pi and whose cathode is connected to a voltage supply line Lvd for supplying a first power supply voltage VDD, and a pn diode 22 serving as a protection device whose cathode is connected to the signal line $L_{s1}$ and whose anode is connected to a voltage supply line Lgd for supplying a ground voltage GND. The signal line $L_{s1}$ connected to the diodes 21 and 22 is also connected to one end of a resistor 23, the other end of which is connected to the drain serving as a third electrode of a depletion type NMOS transistor (hereinafter referred to as a D-NMOS transistor) 24 serving as a first protector, and also to the drain of a D-NMOS transistor 25 serving as another first protector, and still also to the gates of an input PMOS transistor 31 and an NMOS transistor 32 forming an input stage 30 of the internal circuit.

The source serving as a fourth electrode of the D-NMOS transistor 24 is connected to the voltage supply line Lvd and the source of the D-NMOS transistor 25 is connected to the voltage supply line Lgd. The gates of the D-NMOS transistors 24 and 25 are both connected to a power supply line Lvb for supplying a second power supply voltage VBB which is lower than the voltages VDD and GND.

At the input stage 30 of the internal circuit, the drains of the PMOS transistor 31 and NMOS the transistor 32 are connected to each other, the source of the PMOS transistor 31 is connected to the voltage supply line Lvd, and the source of the NMOS transistor 32 is connected to the voltage supply line Lgd.

Figure 5:
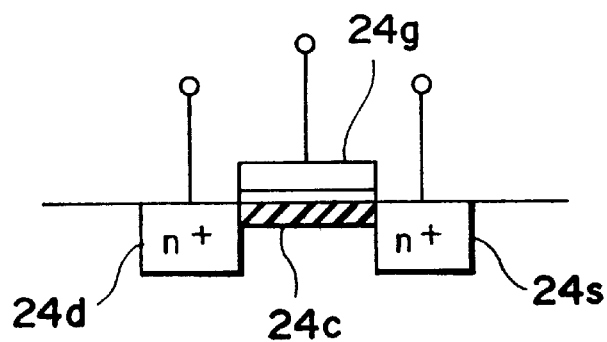
FIG. 5 is a cross-sectional view illustrating the structure of a D-NMOS transistor.
Figure 6:
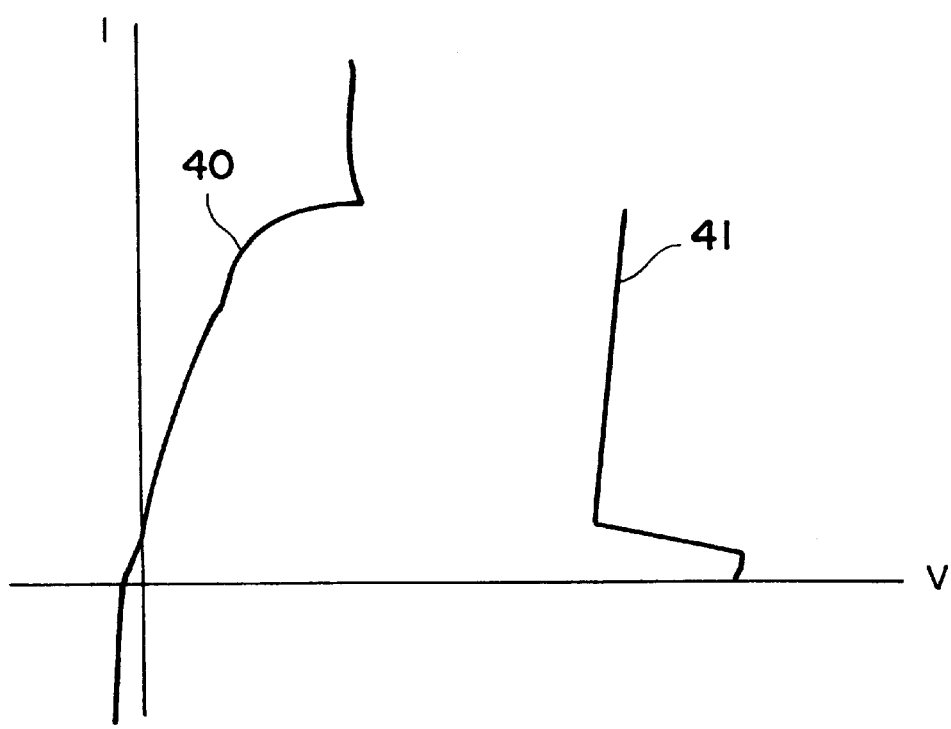
FIG. 6 illustrates the current-voltage characteristic of a D-NMOS transistor.

FIG. 5 is a cross-sectional view illustrating the structure of a D-NMOS transistor, and FIG. 6 is a graph illustrating the current-voltage characteristic of a D-NMOS transistor. Referring to FIGS. 5 and 6, the mechanism of the electrostatic damage which may occur in the CMOS semiconductor integrated circuit is described below.

The possibility that CMOS semiconductor integrated devices may be electrostatically damaged becomes highest when they are in inactive states, that is, when they are handled in an separate state in which no power supply voltage is supplied to the power supply terminal. This can be more easily understood by considering what happens in the semiconductor integrated device when it is in an active state. The semiconductor integrated device becomes active when it is mounted on a printed circuit board or the like in an upper-level system. Once the semiconductor integrated device is mounted on the board, it is connected to other semiconductor integrated devices or electronic components via electric wires. In this state, if an electrostatic surge is applied to a particular terminal, the electrostatic surge is shunted into other semiconductor integrated devices or electronic components, and thus the electrostatic stress is eased compared to the case where the semiconductor integrated device is isolated. That is, the electrostatic damage protection circuit is required to protect the semiconductor integrated device in an inactive state or an isolated state from electrostatic damage.

For example, a D-NMOS transistor 24 shown in FIG. 1 is formed by doping the surface of a p-type substrate, in the region below a gate 24g via a gate oxide film, with an n-type impurity so that an electrically conductive channel region 24c is formed between an n-type source 24s and drain 24d, as shown in FIG. 5. When the semiconductor integrated device is in an inactive state, this D-NMOS transistor 24 acts as a resistor having a characteristic such as that represented by a curve 40 in FIG. 6. If a negative voltage lower than the threshold voltage is applied to the gate 24g of the D-NMOS transistor 24, accumulation occurs at the surface of the p-type substrate and the surface region is converted to a p-type region. As a result, the channel region 24c disappears. Once the channel region 24c disappears, the resistance of the region between the source 24s and the drain 24d becomes extreme high as represented by a characteristic curve 41 in FIG. 6, and thus the source 24s and the drain 24d are substantially isolated from each other. If the semiconductor integrated device is in an active state, that is, if it is installed in an upper-level system, and if the semiconductor integrated device has a voltage step-down circuit, then the D-NMOS transistor 24 can be converted to an insulating element by applying, to the gate 24g, a negative voltage lower than the threshold voltage generated by the voltage step-down circuit. In the case where no voltage step-down circuit is provided in the semiconductor integrated device, the negative voltage may be supplied directly from the external system so as to convert the D-MOS transistor 24 to an insulating element. The D-NMOS transistor 25 acts in a similar manner.

Keeping the above in mind, the operation of the protection circuit shown in FIG. 1 is described below.

In the inactive state in which the gate oxide film can be easily damaged, as described above, the voltage VBB is not supplied via the power supply line Lvb, and thus the D-NMOS transistor 24 acts as a resistor whereby the signal line $L_{s1}$ is short-circuited with the source of the PMOS transistor 31. The D-NMOS transistor 25 behaves in a similar manner, and thus the signal line $L_{s1}$ is short-circuited with the source of the NMOS transistor 32. In this state, if a positive or negative electrostatic surge enters the integrated circuit over the signal line $L_{s1}$, the electrostatic surge is absorbed via the diode 21 or 22 because the signal line $L_{s1}$ is short-circuited with the source of the PMOS input transistor 31 and that of the NMOS input transistor 32. Furthermore, no voltage difference occurs across the gate oxide film located between the gate electrode and the source diffusion layer. Therefore, the gate oxide film is effectively prevented from being damaged regardless of the response speed of the diodes 21 and 22 against the surge.

On the other hand, when a positive electrostatic surge enters the voltage supply line Lvd, the electrostatic surge is passed via the D-NMOS transistors 24 and 25 to the voltage supply line Lgd. In the case where a positive electrostatic surge enters the voltage supply line Lgd, the electrostatic surge is passed via the diodes 21 and 22 and the D-NMOS transistors 24 and 25 to the voltage supply line Lvd.

If the semiconductor integrated device becomes active when a power supply voltage is applied to the power supply terminal, the negative voltage VBB lower than the threshold voltage is supplied from the voltage step-down circuit or from the external circuit, and thus the D-NMOS transistors 24 and 25 come to behave as insulating elements. As a result, the signal line $L_{s1}$ is isolated from the source of the PMOS transistor 31 and from the source of the PMOS transistor 32, thereby ensuring that the semiconductor integrated circuit can operate in a normal manner. In this situation, if an electrostatic surge is applied to the signal line $L_{S1}$, the surge is shunted because the semiconductor integrated device is connected to other semiconductor integrated devices or other electronic components via interconnections formed on a circuit board. Therefore, there is little possibility that the gate oxide film of the PMOS transistor 31 or the NMOS transistor 32 is damaged.

In the first embodiment, as described above, the semiconductor integrated device has the input terminal protection circuit including D-NMOS transistors 24 and 25 which are in an on-state when the semiconductor integrated device is inactive, and which are in an off-state when the semiconductor integrated circuit is active, thereby achieving the following advantages:

1. In the inactive state in which the gate oxide films have a high risk of being damaged, if an electrostatic surge enters the semiconductor integrated device from the outside over the signal line $L_{s1}$ via the input pad Pi, the gate oxide film of the PMOS transistor 31 is protected from the electrostatic surge by the short-circuited path formed by the D-NMOS transistor 24 between the signal line $L_{s1}$ and the source of the PMOS transistor 31. Similarly, the gate oxide film of the NMOS transistor 32 is protected from the electrostatic surge by the short-circuited path formed by the D-NMOS transistor 25 between the signal line $L_{s1}$ and the source of the NMOS transistor 32.

On the other hand, when the semiconductor integrated device is in a state in which it is not easily damaged by an electrostatic surge after being mounted on a circuit board such that it can receive a power supply voltage, the voltage VBB having a negative value lower than the threshold is supplied via the power supply line Lvb so that the D-NMOS transistors 24 and 25 act as insulating elements and thus these transistors do not affect the normal device functions. Thus, an input terminal protection circuit with a high protection ability against electrostatic damage is achieved.

2. Because a high voltage is not applied across the gate oxide film at the location between the gate electrode and the source diffusion layer of the PMOS transistor 31 and 32, it becomes possible to employ a low resistance for the protection resistance 23 for delaying the surge. This allows a reduction in the delay of the gate signal during the normal operation.

Second Embodiment

Figure 7:
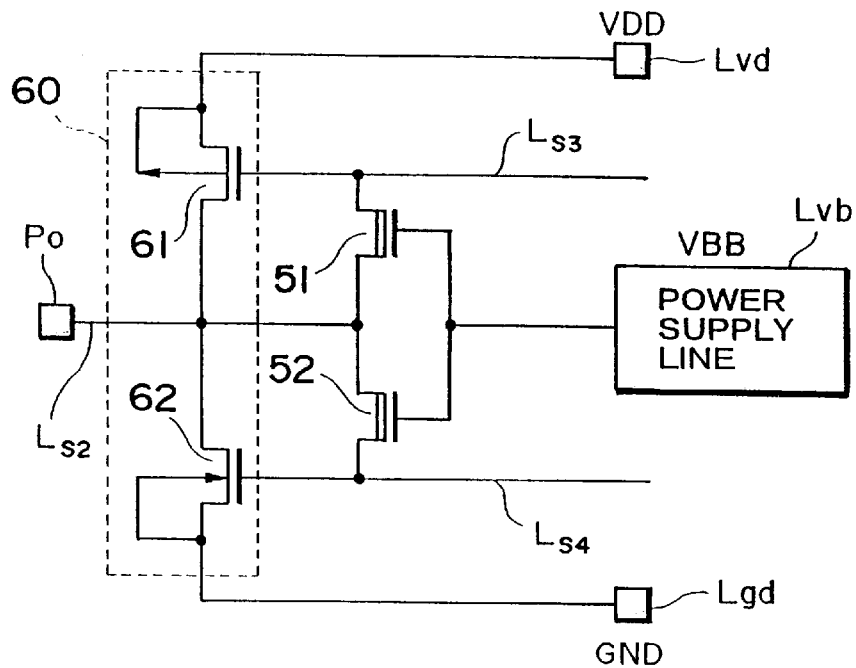
FIG. 7 is a circuit diagram illustrating a second embodiment of a protection circuit according to the present invention.

FIG. 7 is a circuit diagram illustrating a second embodiment of a protection circuit according to the present invention.

This protection circuit is provided with respect to an output pad Po serving as an output terminal of a semiconductor integrated device. The protection circuit includes D-NMOS transistors 51 and 52, wherein the drain. serving as a third electrode of each D-NMOS transistor is connected to a signal line $L_{s2}$ connected to the output pad Po.

The output stage 60 of an internal circuit of the semiconductor integrated device includes a PMOS output transistor 61 and an NMOS output transistor 62 wherein the drains serving as first electrodes of the respective PMOS transistor 61 and NMOS transistor 62 are also connected to the signal line $L_{s2}$. The source serving as a second electrode of the PMOS transistor 61 is connected to a voltage supply line Lvd for supplying a power supply voltage VDD and the gate of the PMOS transistor 61 is connected to an internal signal line L$_{s3}$ of the semiconductor integrated device. The source of the NMOS transistor 62 is connected to a voltage supply line Lgd for supplying a ground voltage GND and the gate of the NMOS transistor 62 is connected to an internal signal line L$_{s4}$ of the semiconductor integrated device. The source serving as a fourth electrode of the D-NMOS transistor 51 is connected to the gate of the PMOS transistor 61, and the source of the D-NMOS transistor 52 is connected to the gate of the PMOS transistor 62. The gates of the D-NMOS transistors 51 and 52 are connected to a power supply line Lvb. The power supply line Lvb serves to supply a voltage VBB having a value lower than the ground voltage GND to the gates of the D-NMOS transistors 51 and 52 when the semiconductor integrated device is in an active state thereby ensuring that the D-NMOS transistor 51 and 52 act as resistors when the semiconductor integrated device is in the inactive state, while the D-NMOS transistors 51 and 52 act as insulating elements when the semiconductor integrated device is in an active state.

The operation of this protection circuit is described below.

The operation of the D-NMOS transistors 51 and 52 in response to the voltage VBB is similar to the first embodiment, and thus it is not described in further herein.

When the semiconductor integrated device is inactive, the gate of the PMOS transistor 61 at the output stage 60 to be protected is short-circuited with the signal line L$_{s2}$, and the gate of the NMOS transistor 62 to be protected is also short-circuited with the signal line L$_{s2}$, via the D-NMOS transistor 51 and 52. If an electrostatic surge is applied to the signal line L$_{s2}$ when the semiconductor integrated device is in this situation, no voltage is applied across the gate oxide films of the PMOS transistor 61 and the NMOS transistor 62.

On the other hand, when the semiconductor integrated device becomes active, the electrical path between the gate of the PMOS transistor 61 and the signal line L$_{s2}$ and the electrical path between the NMOS transistor 62 and the signal line L$_{s2}$ are cut off because the voltage VBB is supplied via the power supply line Lvb to the gates of the D-NMOS transistors 51 and 52 so that the D-NMOS transistors 51 and 52 act as insulating elements and thus their conduction is cut off. In this situation, the PMOS transistor 61 and the NMOS transistor 62 turn on and off in response to the signal on the internal signal lines Ls$_{s3}$ and L$_{s4}$, and a corresponding voltage is generated on the signal line L$_{s2}$ and output via the output pad Po.

In this second embodiment, as described above, the signal line L$_{s2}$ connected to the output pad Po is connected to the D-NMOS transistors 51 and 52 so that when the semiconductor integrated device is inactive, the signal line L$_{s2}$ and the gate of the PMOS transistor 61 are short-circuited and the signal line L$_{s2}$ and the gate of the NMOS transistor 62 are also short-circuited thereby ensuring that the gate oxide films of the PMOS transistor 61 and NMOS transistor 62 are protected from being damaged. When the semiconductor integrated device is in a state in which it is not easily damaged by an electrostatic surge after being mounted on a circuit board such that it can receive a power supply voltage, the D-NMOS transistors 51 and 52 are converted to insulating elements by applying a negative threshold voltage to the gates of the D-NMOS transistors 51 and 52 so that these transistors 51 and 52 do not affect the device functions during a normal operation. Thus, it is possible to achieve an output protection circuit having a high protection ability against an electrostatic damage.

Third Embodiment

Figure 8:
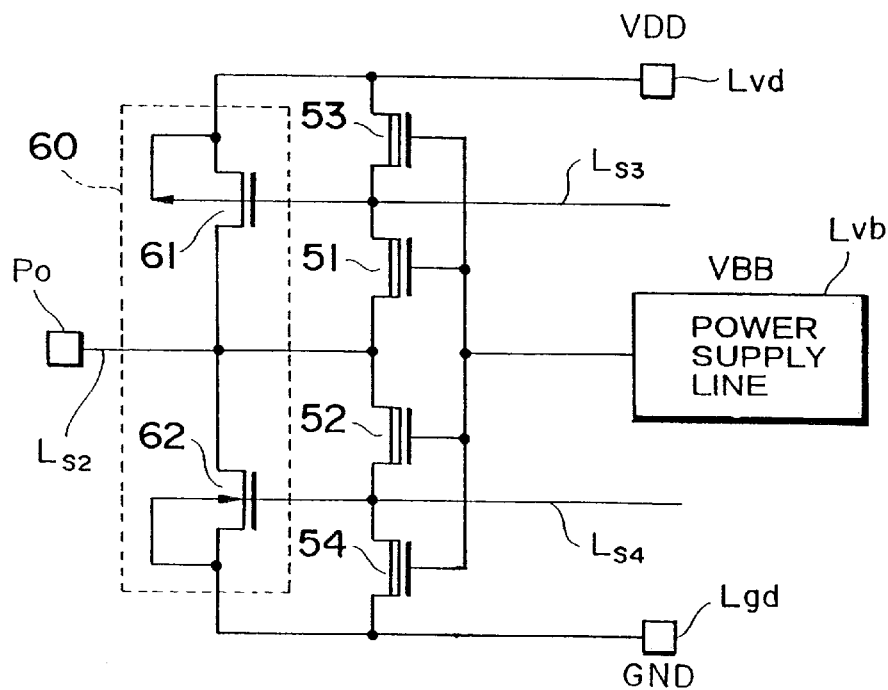
FIG. 8 is a circuit diagram illustrating a third embodiment of a protection circuit according to the present invention.

FIG. 8 is a circuit diagram illustrating a protection circuit according to a third embodiment of the present invention wherein similar elements to those in FIG. 7 are denoted by similar reference numerals or symbols.

The feature of this protection circuit is that second protection means or protectors including D-NMOS transistors 53 and 54 is added to the protection circuit according to the second embodiment. The other parts are similar to those shown in FIG. 7. The drain serving as a third electrode of the D-NMOS transistor 53 is connected to the gate of the PMOS transistor 61 and the source serving as a fourth electrode of the D-NMOS transistor 53 is connected to a voltage supply line Lvd. The drain of the D-NMOS transistor 54 is connected to the gate of the PMOS transistor 62 and the source of the D-NMOS transistor 54 is connected to a voltage supply line Lgd. That is, the gate of the PMOS transistor 61 to be protected is connected to the power supply voltage VDD via the D-NMOS transistor 53, and the gate of the PMOS transistor 62 to be protected is connected to the ground voltage GND via the D-NMOS transistor 54. The gates of the respective D-NMOS transistors 53 and 54 are connected to the power supply line Lvb.

The operation of the D-NMOS transistors 51, and 52 is similar to that in the second embodiment, and thus a duplicated description is not given here.

In this protection circuit, when the semiconductor integrated device is inactive, the D-NMOS transistors 51 to 54 are in on-states and thus the signal line L$_{s2}$ is connected to the voltage supply line Lvd via two D-NMOS transistors 51 and 53 and the signal line L$_{s2}$ is also connected to the voltage supply line Lgd via two D-NMOS transistors 52 and 54 so that the signal line L$_{s2}$ is short-circuited with the voltage supply line Lgd. In this state, if an electrostatic surge enters through the output pad Po, the electrostatic surge is passed directly to the voltage supply line Lvd via the two D-NMOS transistors 51 and 53 or directly to the voltage supply line Lgd via the D-NMOS transistors 52 and 54.

On the other hand, when the semiconductor integrated device becomes active, the voltage VBB is supplied to the D-NMOS transistors 51 to 54 via the power supply line Lvb. As a result, the D-NMOS transistors 51 and 53 are converted to insulating elements and thus the drain, source, and gate of the PMOS transistor 61 are isolated from one another. Similarly, the D-NMOS transistors 52 and 54 are converted to insulating elements and thus the drain, source, and gate of the PMOS transistor 62 are isolated from one another.

In the third embodiment, as described above, the D-NMOS transistors 53 and 54 are added to the protection circuit according to the second embodiment. As a result, further advantages in addition to those achieved in the second embodiment are achieved as described below.

1. In the inactive state in which the semiconductor integrated device is sensitive to an electrostatic surge, if an electrostatic surge enters via the output pad Po, the electrostatic surge is passed directly to the voltage supply line Lvd or Lgd thereby preventing the gate oxide films from being damaged in a more reliable fashion than the second embodiment, without affecting the normal device functions.

2. A surge current flowing into the internal signal line L$_{s3}$ via the D-NMOS transistor 52 or a surge current flowing into the internal signal line L$_{s4}$ via the D-NMOS transistor 52 is passed to the voltage supply line Lvd or Lgd via the path formed by the D-NMOS transistor 53 or 54 thereby ensuring that the internal signal lines L$_{s3}$ and L$_{s4}$ are prevented from being damaged by the surge current.

Fourth Embodiment

Figure 9:
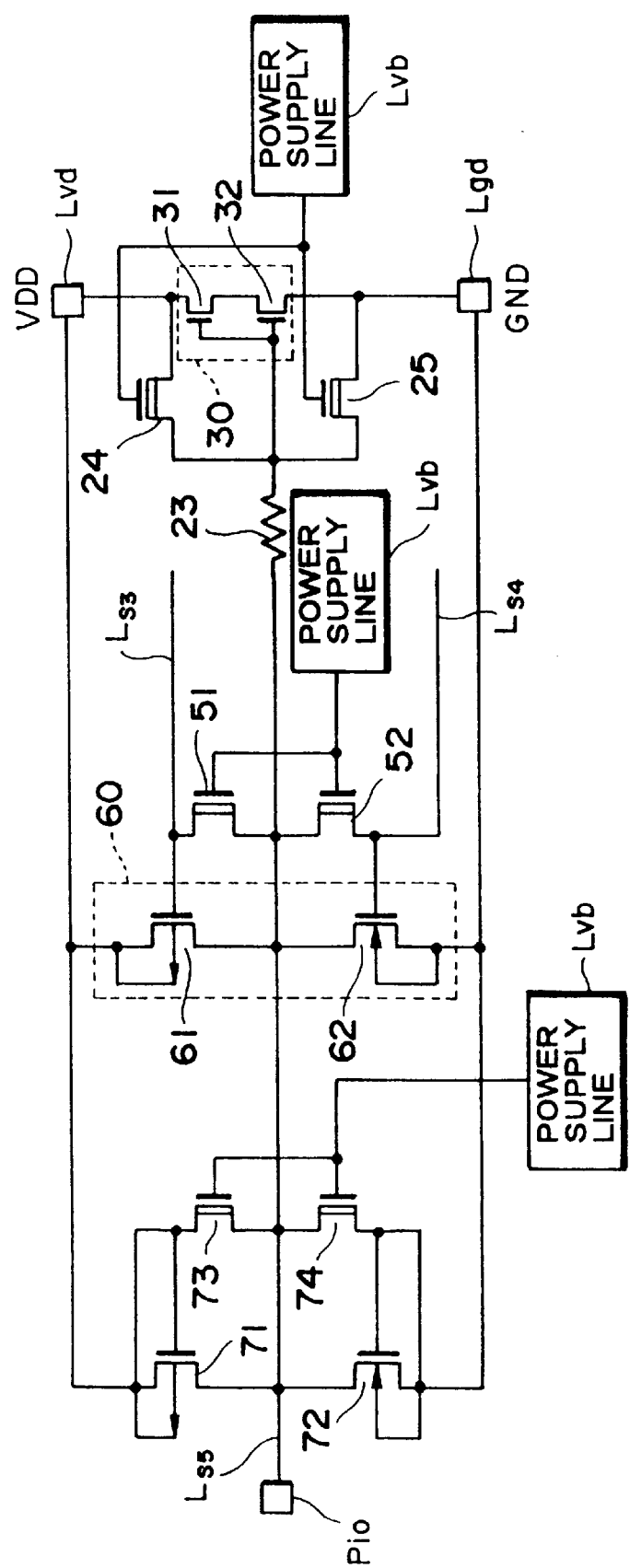
FIG. 9 is a circuit diagram illustrating a fourth embodiment of a protection circuit according to the present invention.

FIG. 9 is a circuit diagram illustrating a protection circuit according to a fourth embodiment of the present invention wherein similar elements to those in FIG. 1 or 7 are denoted by similar reference numerals or symbols.

This protection circuit is provided to protect an input/output pad Pio of a semiconductor integrated device. The protection circuit includes a resistor 23 and D-NMOS transistors 24 and 25, which are similar to those employed in the first embodiment and which serve to protect PMOS transistors 31 and 32 forming an input stage 30. The protection circuit also includes D-NMOS transistors 51 and 52, which are similar to those employed in the second embodiment and which serve to protect PMOS transistors 61 and 62 forming an output stage 60. The resistor 23, the D-NMOS transistors 24 and 25, and the D-NMOS transistors 51 and 52 are connected to a signal line $L_{s5}$ for inputting and outputting a signal via the input/output pad Pio, wherein connections are made in a similar manner to those in the first or second embodiment.

The protection circuit further includes: a PMOS transistor 71 serving as a protection transistor whose drain serving as a first electrode is connected to the signal line $L_{s5}$ and whose source serving as a second electrode and gate are connected to a voltage supply line Lvd; an NMOS transistor 72 serving as a protection transistor whose drain is connected to the signal line $L_{s5}$ and whose source and gate are connected to the voltage supply line Lvd; a D-NMOS transistor 73 serving as third protection means or protector whose drain serving as a third electrode is connected to the signal line $L_{s5}$ and whose source serving as a fourth electrode is connected to the gate of the PMOS transistor 71; and a D-NMOS transistor 74 serving as third protection means or protector whose drain is connected to the signal line $L_{s5}$ and whose source is connected to the gate of the NMOS transistor 72. The gates of the D-NMOS transistors 73 and 74 are connected in common to the power supply line Lvb.

The protection circuit show in FIG. 9 operates as follows.

The resistor 23 and the D-NMOS transistors 24 and 25 for protecting the input stage 30 of the semiconductor integrated device and D-NMOS transistors 51 and 52 for protecting the output stage 60 operate in basically the same fashion as corresponding elements in the first or second embodiment and thus these are not described in further detail here.

The circuit shown in FIG. 9 includes additional elements to be protected. That is, they are two gate oxide films located between the gates of the PMOS transistor 71 and the NMOS transistor 72 and the drain diffusion layers connected to the signal line $L_{s5}$. The PMOS transistor 71 and the NMOS transistor 72 operate as follows. If an electrostatic surge is applied to the signal line $L_{s5}$, a breakdown occurs between the substrate and the drains of those transistors and a surge current is passed as a bipolar current to the voltage supply line Lvd or Lgd. When the semiconductor integrated device is inactive, D-NMOS transistors 73 and 74 act as resistors whereby the gates of the PMOS transistor 71 and the NMOS transistor 72 are short-circuited with the signal line $L_{s5}$. Therefore, even when an electrostatic surge is applied to the input/output pad Pio, no high voltage is applied across the gate oxide films of the PMOS transistor 71 and the NMOS transistor 72.

On the other hand, when the semiconductor integrated circuit is active, a voltage VBB is supplied to the gates of the D-NMOS transistors 73 and 74 via the power supply line Lvb. As a result, the D-NMOS transistors 73 and 74 act as insulating elements. Thus, the electrical connection between the gate of the PMOS transistor 71 and the signal line $L_{s5}$ and the electrical connection between the gate of the NMOS transistor 72 and signal line $L_{s5}$ are cut off.

In this fourth embodiment, as described above, in the input/output protection circuit including the PMOS transistor 71 and the NMOS transistor 72 which are connected between the signal line $L_{s5}$ and the voltage supply line Lvd or Lgd and whose gate is connected so that the PMOS transistor 71 and the NMOS transistor 72 are in off-states in the normal operating state, there are provided D-NMOS transistors 73 and 74 which act as resistors when the semiconductor integrated device is inactive and which act as insulating elements when the semiconductor integrated device is active thereby achieving the following advantages:

1. When the semiconductor integrated device is inactive, the signal line $L_{s5}$ and the gate of the PMOS transistor 71 are short-circuited via the D-NMOS transistor 73 and the signal line $L_{s5}$ and the gate of the NMOS transistor 72 are short-circuited via the D-NMOS transistor 74 so that no high voltage is applied across the gate oxide films of the PMOS transistor 71 and the NMOS transistor 72 thereby ensuring that these gate oxide films are protected. On the other hand, when the semiconductor integrated device is in a state in which it is not easily damaged by an electrostatic surge after being mounted on a circuit board such that it can receive a power supply voltage, the D-NMOS transistors 73 and 74 act insulating elements and thus the gates of the PMOS transistor 71 and the NMOS transistor 72 are electrically disconnected from the signal line $L_{s5}$ so that the normal device functions are achieved without being subjected to adverse influence. Thus, an input/output protection circuit with a high protection ability against electrostatic damage is achieved.

2. In a common process for production of semiconductor integrated devices, the driving transistors 31, 32, 61, and 62 at the input stage 30 or output stage 60 are formed at the same time as the protection transistors 71 and 72 for protection against electrostatic damage. As a result, the thickness of the gate oxide films of the driving transistors 31, 32, 61, and 62 is equal to that of the protection transistors 73 and 74. This means that if the thickness of the gate oxide film is reduced so as to reduce element device sizes, the gate oxide films of the protection transistors 71 and 72 becomes more sensitive to electrostatic damage. However, in this fourth embodiment, no high voltage is applied across the gate oxide film located between the gate and the drain diffusion layer of the protection transistor 71 and 72, and thus, in the semiconductor production process, the thickness of the gate oxide film can be selected without being limited by the breakdown voltage. Thus, it is possible to employ even a thin gate oxide film having an intrinsic breakdown voltage lower than the drain breakdown voltage. That is, it is possible to employ a thin oxide film for both types of transistors: the protection transistors 71 and 71; and the driving transistors 31, 32, 61, and 62. This allows improvements in the response speed and the current driving ability of the driving transistors while achieving the ability of protecting not only the gate oxide film of the driving transistors 31, 32, 61, and 62 but also the gate oxide film of the protection transistors 71 and 72. Thus a great improvement in the performance of the semiconductor integrated circuit can be achieved and the production process parameters can be selected in a more flexible fashion.

Fifth Embodiment

Figure 10:
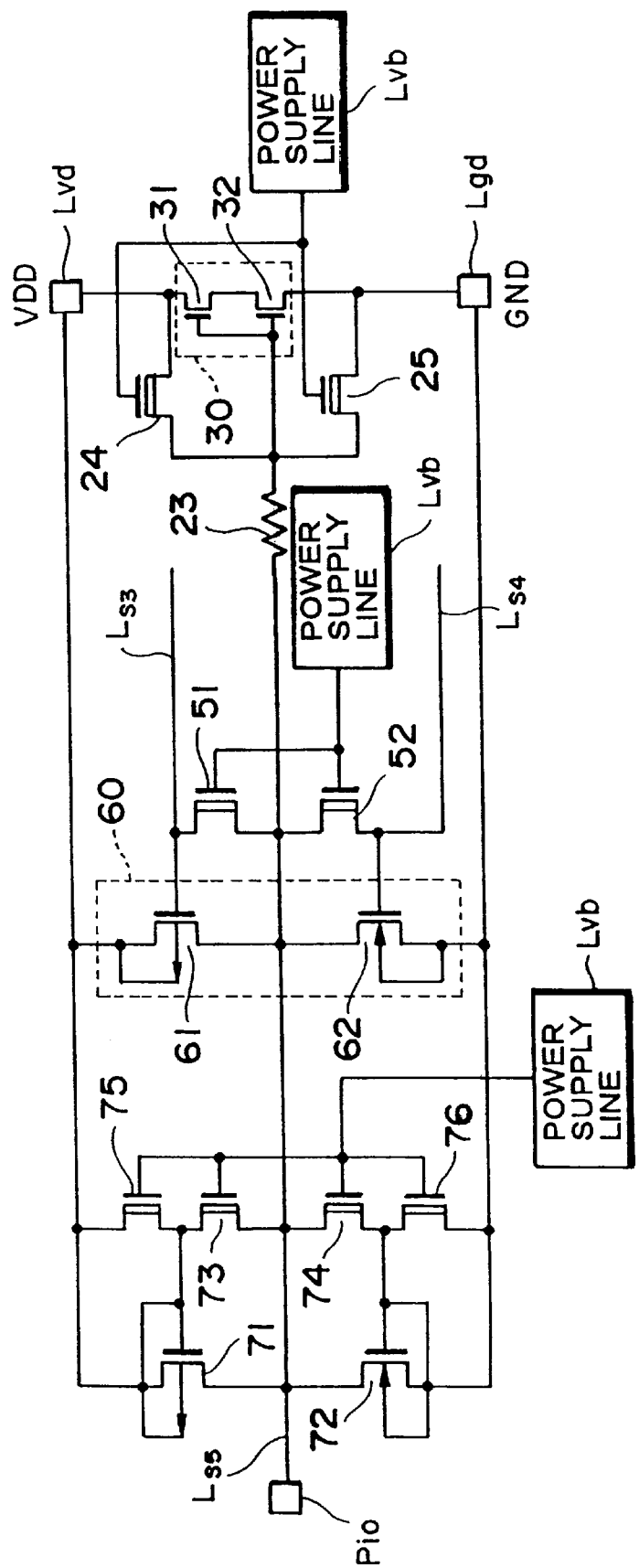
FIG. 10 is a circuit diagram illustrating a fifth embodiment of a protection circuit according to the present invention.

FIG. 10 is a circuit diagram illustrating a fifth embodiment of a protection circuit according to the present invention wherein similar elements to those in FIG. 9 representing the fourth embodiment are denoted by similar reference numerals or symbols.

The feature of this protection circuit is that fourth protection means or protector including D-NMOS transistors 75 and 76 is added to the protection circuit according to the fourth embodiment. The other parts are similar to those of the fourth embodiment shown in FIG. 9. The drain serving as a third electrode and the source serving as a fourth electrode of the D-NMOS transistor 75 are connected between the gate of an NMOS transistor 71 and a voltage supply line Lvd. The drain and the source of the D-NMOS transistor 76 are connected between the gate of an NMOS transistor 72 and a voltage supply line Lgd. The gates of the D-NMOS transistors 75 and 76 are connected in common to a power supply line Lvb.

The protection circuit show in FIG. 10 operates as follows.

The resistor 23 and the D-NMOS transistors 24 and 25 for protecting the input stage 30 of the semiconductor integrated device and D-NMOS transistors 51 and 52 for protecting the output stage 60 operate in basically the same fashion as corresponding elements in the first or second embodiment. The PMOS transistor 71 and the NMOS transistor 72 operate in the same manner as corresponding transistors in the fourth embodiment. Thus those elements are not described in further detail here.

When the semiconductor integrated device is in inactive, D-NMOS transistors 73 to 76 act as resistors and thus a signal line $L_{s5}$ is electrically connected to the voltage supply line Lvd via the D-NMOS transistors 73 and 75 so that the signal line $L_{s5}$ is short-circuited. Furthermore, the signal line $L_{s5}$ is also electrically connected to the voltage supply line Lgd via the D-NMOS transistors 72 and 76 so that the signal line $L_{s5}$ is short-circuited. In this situation, if an electrostatic surge is applied to the signal line $L_{s5}$ via an input/output pad Pio, the surge is directly passed to the voltage supply line Lvd or Lgd.

On the other hand, when the semiconductor integrated device becomes active, a negative voltage VBB lower than the threshold voltage of the D-NMOS transistors 73 to 76 is supplied via the power supply line Lvb and thus the D-NMOS transistors 73 to 76 come to act as insulating elements. As a result, the gate of the PMOS transistor 71 and the gate of the NMOS transistor 72 are electrically disconnected from the signal line $L_{s5}$ and the voltage supply line Lvd or Lgd. That is, when the semiconductor integrated device is in the active state, the normal device functions of the semiconductor integrated device can be achieved without being subjected to adverse influence.

In this fifth embodiment, as described above, the D-NMOS transistor 75 and 76 are added to the protection circuit according to the fourth embodiment. As a result, further advantages in addition to those achieved in the fourth embodiment are achieved as described below.

1. When an electrostatic surge enters through the input/output pad Pio, the electrostatic surge is directly passed to the voltage supply line Lvd or Lgd thereby preventing the gate oxide films of the PMOS transistor 71 and the NMOS transistor 72 from being damaged in a more reliable fashion than the fourth embodiment.

2. The D-NMOS transistor 75 provides a path via which an electrostatic surge which would otherwise flow into the gate of the PMOS transistor 71 via the D-NMOS transistor 73 is passed to the voltage supply line Lvd. Similarly, the D-NMOS transistor 76 provides a path via which an electrostatic surge which would otherwise flow into the gate of the NMOS transistor 72 via the D-NMOS transistor 74 is passed to the voltage supply line Lgd. As a result, the lines via which the gates of the PMOS transistor 71 and the NMOS transistor 72 are connected to the power supply line Lvb are prevented from being damaged.

Sixth Embodiment

Figure 11:
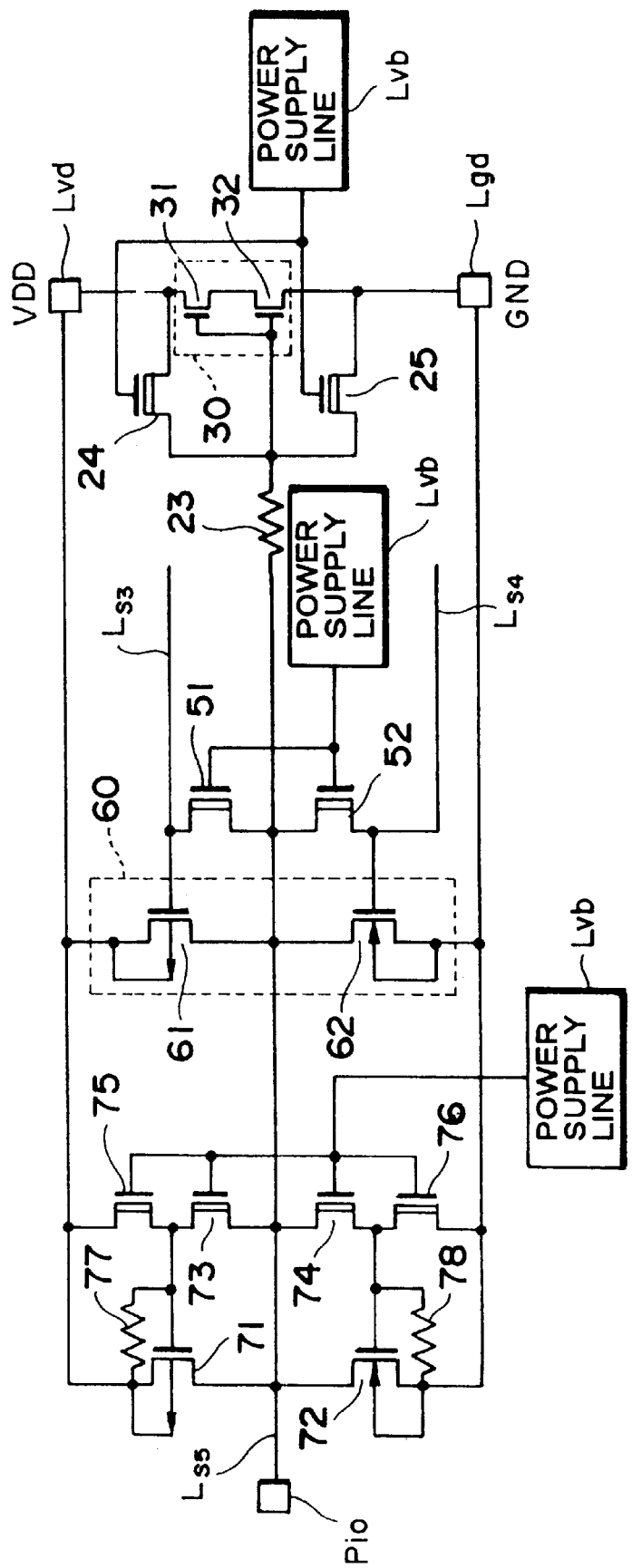
FIG. 11 is a circuit diagram illustrating a sixth embodiment of a protection circuit according to the present invention.

FIG. 11 is a circuit diagram illustrating a protection circuit according to a sixth embodiment of the present invention wherein similar elements to those in FIG. 10 representing the fifth embodiment are denoted by similar reference numerals or symbols.

The feature of this protection circuit is that an additional resistor 77 is connected between the gate of the PMOS transistor 71 and the voltage supply line Lvd of the protection circuit according to the fifth embodiment and an additional resistor 78 is connected between the gate of the NMOS transistor 72 and the voltage supply line Lgd. The other parts are similar to those of the fifth embodiment shown in FIG. 10. The resistance Ri of the resistor 77, the resistance R2 of the D-NMOS transistor 73, and the resistance R3 of the D-NMOS transistor 75 are set such that equation (1) described below is satisfied.

$$R1 \times R3/(R1+R3) \geq \frac{1}{4} \times R2 \tag{1}$$

Furthermore, the resistance R4 of the resistor 78, the resistance R5 of the D-NMOS transistor 74, and the resistance R6 of the D-NMOS transistor 76 are set such that equation (2) described below is satisfied.

$$R4 \times R6/(R4+R6) \geq \frac{1}{4} \times R5 \tag{2}$$

Figure 12:
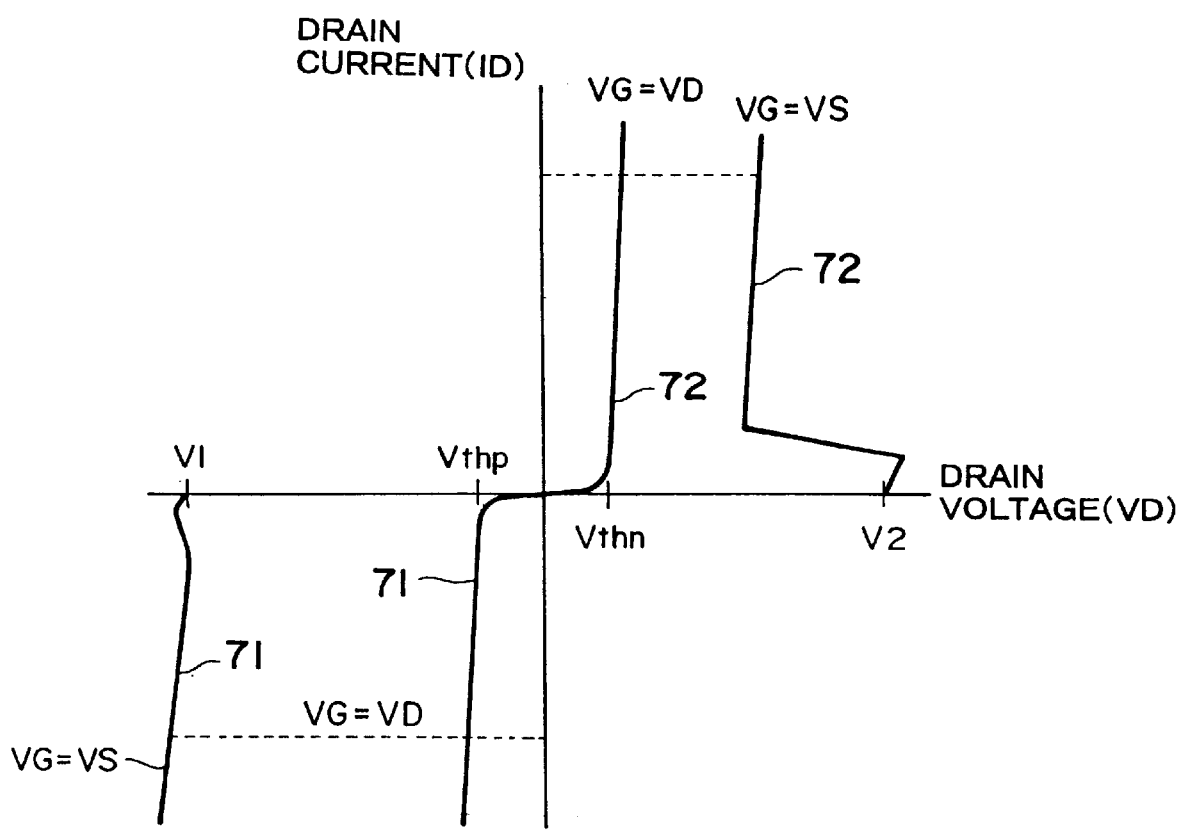
FIG. 12 illustrates the current-voltage characteristic of the protection transistor shown in FIG. 11.

FIG. 12 illustrates the current-voltage characteristic of the protection transistors shown in FIG. 11. Referring to FIG. 12, the operation of the protection circuit shown in FIG. 11 is described below.

Herein, the operation start voltage is defined as a particular value of the drain voltage at which a drain current starts to flow. In the case of the PMOS transistor 71 whose gate is electrically connected to the drain (VG=VD) and whose source is grounded, a channel is formed under the gate when the drain voltage becomes lower than the threshold voltage Vthp, and a transistor current starts to flow. That is, the operation start voltage is equal to the threshold voltage. On the other hand, in the case of the PMOS transistor 71 whose gate is electrically connected to the source (VG=VS), no channel is formed under the gate and thus no current flows when the drain voltage reaches the threshold voltage Vthp. If the drain voltage is further lowered below the breakdown voltage V1, a current starts to flow. Thus, in this case, the operation start voltage is equal to the breakdown voltage V1. When a PMOS transistor is used as a protection transistor, the gate is usually connected to the source. In the NMOS transistor 72, if the gate is electrically connected to the drain, a transistor current starts to flow when the drain voltage becomes higher than the threshold voltage and thus the operation start voltage is equal to the threshold voltage Vthn. On the other hand, when the gate is electrically connected to the source, the operation start voltage is equal to the breakdown voltage V2. As in the case of the PMOS transistor, when a NMOS transistor is used as a protection transistor, the gate is usually connected to the source.

When a transistor is subjected to an electrostatic surge, the transistor damaged by the Joule heat arising from the surge. Because the Joule heat is defined by (drain current)×(drain voltage), if the drain voltage is reduced then the current can be increased by an amount corresponding to the reduction in the drain voltage, and thus it becomes possible to achieve a higher protection ability against electrostatic damage. In general, the threshold voltage of transistors is of the order of a few tenths of a volt. On the other hand, the breakdown voltage VB is of the order of 7 or 8 to a few tens volts. Therefore, when the gate of the protection transistor is electrically connected to the drain, the operation start voltage is lower than that obtained when the gate is electrically connected to the source, and thus the drain voltage of the protection transistor whose gate is connected to the drain is lower than that of the protection transistor whose gate is connected to the source in the situation in which a surge current is flowing. This means that the protection transistor whose gate is connected to the drain has a high protection ability against to electrostatic damage.

In FIG. 11, the signal line $L_{s5}$ is connected to the gate of the PMOS transistor 71 via the D-NMOS transistor 73, and the gate of the PMOS transistor 71 is further connected to the voltage supply line Lvd via the resistor 77 and the D-NMOS transistor 75. Herein, if the conditions represented by equations (1) and (2) are satisfied, when a negative electrostatic surge is applied to the signal line $L_{s5}$ when the semiconductor integrated circuit is in an inactive state, the gate voltage of the PMOS transistor 71 becomes lower than its threshold voltage Vthp and thus a channel is formed under the gate whereby the electrostatic surge current is absorbed as a transistor current into the voltage supply line Lvd. Similarly, in the case of the NMOS transistor 72, when a positive electrostatic surge enters, the gate voltage of the NMOS transistor 72 becomes higher than its threshold voltage Vthn, and thus a channel is formed under the gate whereby the electrostatic surge current is absorbed as a transistor current into the voltage supply line Lgd. The operations of the other parts are similar to those in the fifth embodiment.

In the sixth embodiment, as described above, there are provided resistors 77 and 78 whereby, if a negative electrostatic surge enters via the input/output pad Pio when the semiconductor integrated device is inactive, the gate voltage of the PMOS transistor 71 is lowered toward the drain voltage by the electrostatic surge, and a channel is formed under the gate and thus the surge current is passed as a transistor current directly to the voltage supply line Lvd. Similarly, when a positive electrostatic surge enters, the gate voltage of the NMOS transistor 72 is raised toward the signal line $L_{s5}$, and the surge current is passed as a transistor current directly to the voltage supply line Lgd. On the other hand, when the semiconductor integrated device is active, a negative voltage VBB equal to the threshold voltage is applied to the gates of the D-NMOS transistors 73 and 75 and also to the gates of the D-NMOS transistors 74 and 76 so that they behave as insulating elements thereby ensuring that the normal operation of the semiconductor integrated device is achieved without encountering adverse effects. That is, because the PMOS protection transistor 71 and the NMOS protection transistor 72 start to operate as protection transistors when a voltage equal to the threshold voltage is applied, the drain voltage becomes smaller than that of the protection circuit which starts to operate at the breakdown voltage. As a result, the Joule heat becomes smaller. Furthermore, the PMOS transistor 71 and the NMOS transistor 72 itself can be protected from damage with a smaller transistor area than required in the fifth embodiment.

Seventh Embodiment

Figure 13:
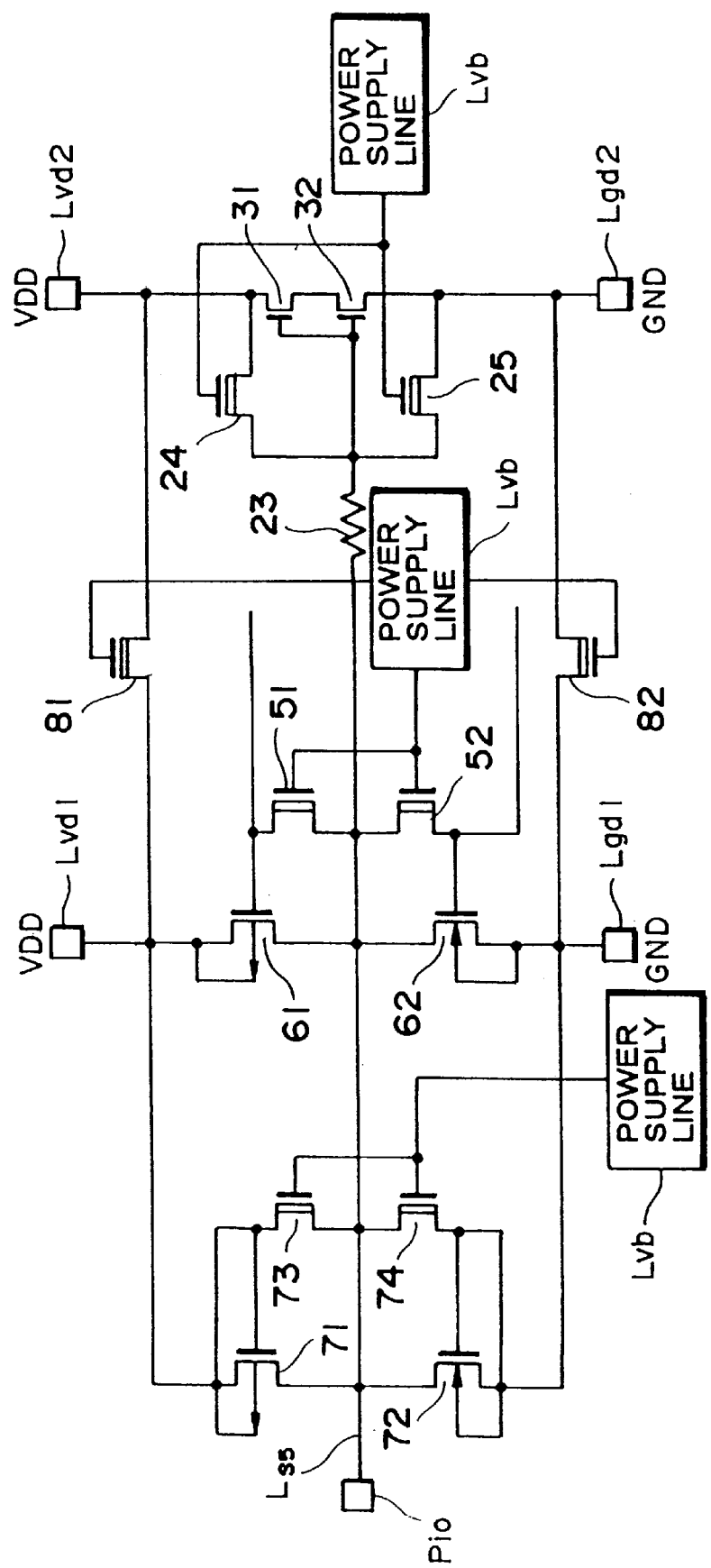
FIG. 13 is a circuit diagram illustrating a seventh embodiment of a protection circuit according to the present invention.

FIG. 13 is a circuit diagram illustrating a protection circuit according to a seventh embodiment of the present invention wherein similar elements to those in FIG. 9 representing the fourth embodiment are denoted by similar reference numerals or symbols.

The protection circuit shown in FIG. 13 is for a semiconductor integrated device including a plurality of power supply terminals for receiving an equal power supply voltage, a plurality of lines for transferring an equal voltage VDD from the respective terminals, and a plurality of lines for transferring an equal ground voltage GND.

That is, the fourth embodiment is modified such that the sources of the PMOS transistors 61 and 71 are connected to a voltage supply line Lvd1, the source of the PMOS transistor 31 at the input stage 30 is connected to a voltage supply line Lvd2, the sources of the NMOS transistors 62 and 72 are connected to a voltage supply line Lgd1, and the source of the NMOS transistor 32 is connected to a voltage supply line Lgd2. Furthermore, the voltage supply line Lvd1 is also connected to the drain serving as a third electrode of a D-NMOS transistor 81 serving as fifth protection means or protector, and the source serving as a fourth electrode of the D-NMOS transistor 81 is connected to the voltage supply line Lvd2. Similarly, the voltage supply line Lgd1 is also connected to the drain serving as a third electrode of a D-NMOS transistor 82 serving as another fifth protector, and the source serving as a fourth electrode of the D-NMOS transistor 82 is connected to the voltage supply line Lgd2. The gates of the D-NMOS transistors 81 and 82 are connected to a power supply line Lvb. The other parts are similar to those of the ninth embodiment shown in FIG. 9.

In this protection circuit, when the semiconductor integrated device is inactive, the voltage supply lines Lvd1 and Lvd2 are short-circuited via the D-NMOS transistor 81 and the voltage supply lines Lgd1 and Lgd2 are short-circuited via the D-NMOS transistor 82. In this situation, if an electrostatic surge is applied for example between the voltage supply line Lvd2 and the signal line $L_{s5}$, a surge current flows to the gate of the PMOS transistor 71. However, because this gate is short-circuited, the surge current is passed to the voltage supply line Lvd1. This surge current is released to the voltage supply line Lvd2 via the D-NMOS transistor 81 because the voltage supply lines Lvd1 and Lvd2 are short-circuited via the D-NMOS transistor 81. On the other hand, when the semiconductor integrated device is active, a negative voltage VBB equal to the threshold voltage is applied via the power supply line Lvb to the gates of the D-NMOS transistors 81 and 82 so that they behave as insulating elements thereby ensuring that the normal operation of the semiconductor integrated device is achieved without encountering adverse effects. The operations of the other parts are similar to those in the fourth embodiment.

In this seventh embodiment, as described above, the D-NMOS transistor 81 is disposed between the voltage supply lines Lvd1 and Lvd2 which are separately formed so as to supply an equal voltage VDD, and the D-NMOS transistor 82 is disposed between the voltage supply lines Lgdl and Lgd2 so that when an electrostatic surge enters through a power supply terminal or a ground terminal other than the terminal connected to the PMOS protection transistor 71 or the NMOS protection transistor 72, the power supply terminals or the ground terminals are short-circuited together via the D-NMOS transistor 81 or 82. As a result, the PMOS transistor 71 or the NMOS transistor 72 behaves as a protection transistor for the voltage supply line Lvd2 or Lgd2 connected to the terminal having no dedicated protection transistor. Thus a higher protection ability against electrostatic damage is achieved.

Although in FIG. 13, there are two voltage supply lines for separately supplying an equal voltage, there may be three or more such supply lines. In such a case, similar transistors to the D-NMOS transistors 81 and 82 are disposed so that the plurality of voltage supply lines are connected to one another in a parallel fashion. This makes it possible to effectively achieve a high protection ability against electrostatic damage using a small number of D-NMOS transistors.

Eighth Embodiment

Figure 14:
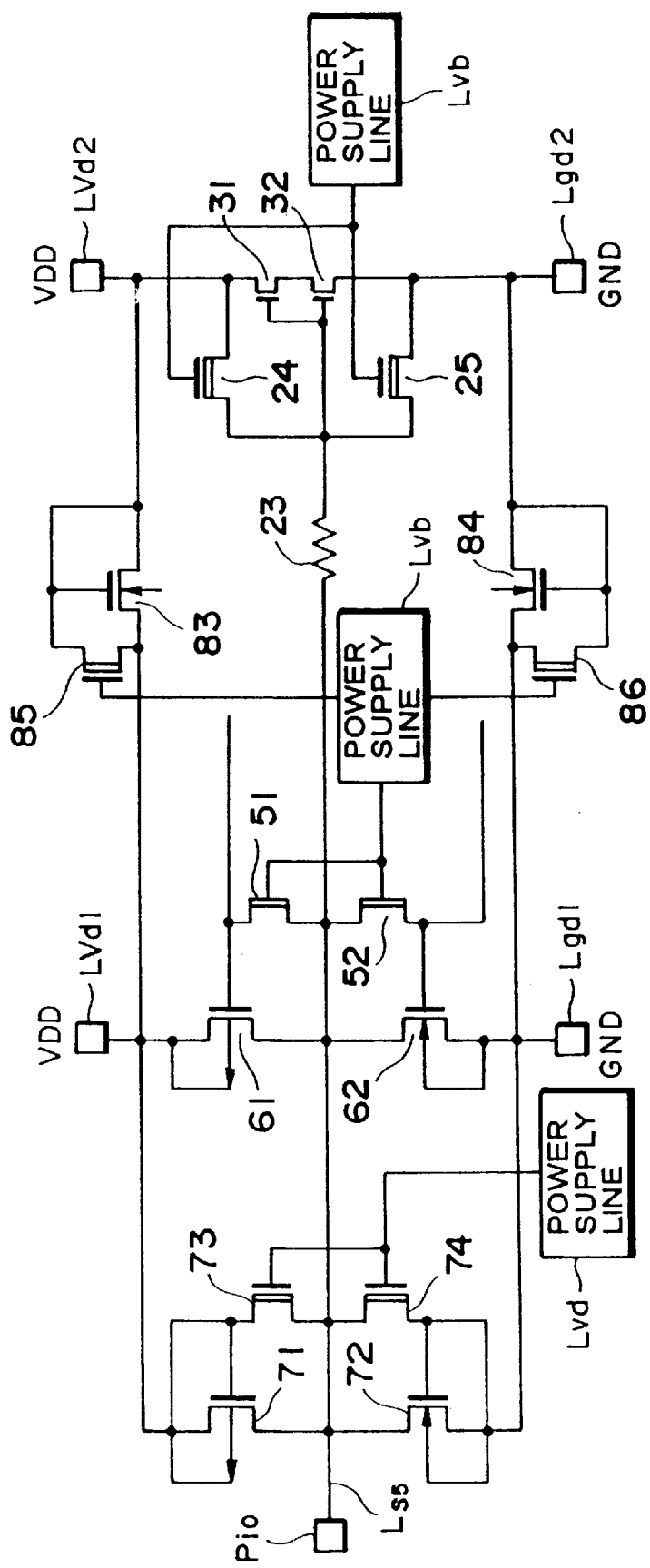
FIG. 14 is a circuit diagram illustrating an eighth embodiment of a protection circuit according to the present invention.

FIG. 14 is a circuit diagram illustrating an eighth embodiment of a protection circuit according to the present invention wherein similar elements to those in FIG. 13 representing the seventh embodiment are denoted by similar reference numerals or symbols.

This protection circuit is also for a semiconductor integrated device including a plurality of voltage supply lines for separately supplying an equal power supply voltage VDD or an equal ground voltage GND. As in the seventh embodiment, the sources of PMOS transistors 61 and 71 are connected a voltage supply line Lvd1, the source of a PMOS transistor 31 at an input stage 30 is connected to a voltage supply line Lvd2, the sources of NMOS transistors 62 and 72 are connected a voltage supply line Lgd1, and the source of an NMOS transistor 32 is connected to a voltage supply line Lgd2.

In this protection circuit, the drain serving as a first electrode of an NMOS protection transistor 83 is connected to the voltage supply line Lvd1. The source serving as a second electrode and the gate of the NMOS protection transistor 83 is connected to the voltage supply line Lvd2. Similarly, the drain serving as a first electrode of an NMOS protection transistor 84 is connected to the voltage supply line Lgd1, and the source serving as a second electrode and the gate of the NMOS protection transistor 84 is connected to the voltage supply line Lgd2. The gate and the drain of the NMOS transistor 83 are connected to each other via a D-NMOS transistor 85 serving as sixth protection means or protector. Similarly, the gate and the drain of the NMOS transistor 84 are connected to each other via a D-NMOS transistor 86 serving as another sixth protector. The gates of the D-NMOS transistors 85 and 86 are connected to the power supply line Lvb.

The protection circuit show in FIG. 14 operates as follows.

When the semiconductor integrated device is inactive, the gate of the NMOS transistor 83 and the voltage supply line Lvdl is short-circuited via the D-NMOS transistor 85 and the gate of the NMOS transistor 84 and the voltage supply line Lgd1 is short-circuited via the D-NMOS transistor 86. In this situation, if an electrostatic surge is applied between the voltage supply line Lvd2 and the signal line $L_{s5}$, a surge current flows to the gate of the PMOS transistor 71 via the D-NMOS transistor 73. However, because the gate of the PMOS transistor 71 is connected to the voltage supply line Lvd1, the surge current is directly passed to the voltage supply line Lvd1. After that, a breakdown occurs in the NMOS transistor 83 and the electrostatic surge is passed to the voltage supply line Lvd2 via the NMOS transistor 83. Until the NMOS transistor 83 becomes ready to pass the electrostatic surge to the voltage supply line Lvd2, the D-NMOS transistor 85 prevents the surge voltage from being applied across the gate oxide film located between the gate and the drain diffusion layer of the NMOS transistor 83 thereby protecting the NMOS transistor 83 from damage. On the other hand, if an electrostatic surge is applied between the voltage supply line Lgd2 and the signal line $L_{s5}$, a surge current flows to the gate of the PMOS transistor 72 via the D-NMOS transistor 74, and further to the voltage supply line Lgd1. After that, a breakdown occurs in the NMOS transistor 84 and the electrostatic surge is passed to the voltage supply line Lgd2 via the NMOS transistor 84. Until the NMOS transistor 84 becomes ready to pass the electrostatic surge to the voltage supply line Lgd2, the D-NMOS transistor 86 prevents the surge voltage from being applied across the gate oxide film located between the gate and the drain diffusion layer of the NMOS transistor 84 thereby protecting the NMOS transistor 84 from damage.

On the other hand, when the semiconductor integrated device is active, a voltage VBB is applied via the power supply line Lvb to the D-NMOS transistors 85 and 86 so that they behave as insulating elements and thus their conduction is cut off thereby ensuring that the normal operation of the semiconductor integrated device is achieved without encountering adverse effects. The operations of the other parts are similar to those in the fourth or seventh embodiment.

In this eighth embodiment, as described above, the D-NMOS transistors 85 and 86 are added to the protection circuit which works in such a manner that when an electrostatic surge enters through a power supply terminal or a ground terminal other than the terminal connected to the PMOS protection transistor 71 or the NMOS protection transistor 72, the electrostatic surge is first passed to the voltage supply line Lvd1 or Lgd1 connected to the PMOS transistor 71 or the NMOS protection transistor 72, and then the electrostatic surge is finally released to the voltage supply line Lvd2 or Lgd2 via the NMOS transistor 83 or 84. The D-NMOS transistors 85 and 86 prevent the gate oxide films of the NMOS transistors 83 and 84 from being subjected to a high voltage thereby protecting these gate oxide films from damage. This allows it to dispose protection transistors 83 and 84, having a thin oxide film with an intrinsic breakdown voltage lower than the drain breakdown voltage, between the voltage supply lines Lvds and Lvdw or between the voltage supply lines Lgd1 and Lgd2. This also allows it to select the production process parameters in a more flexible fashion.

Ninth Embodiment

Figure 15:
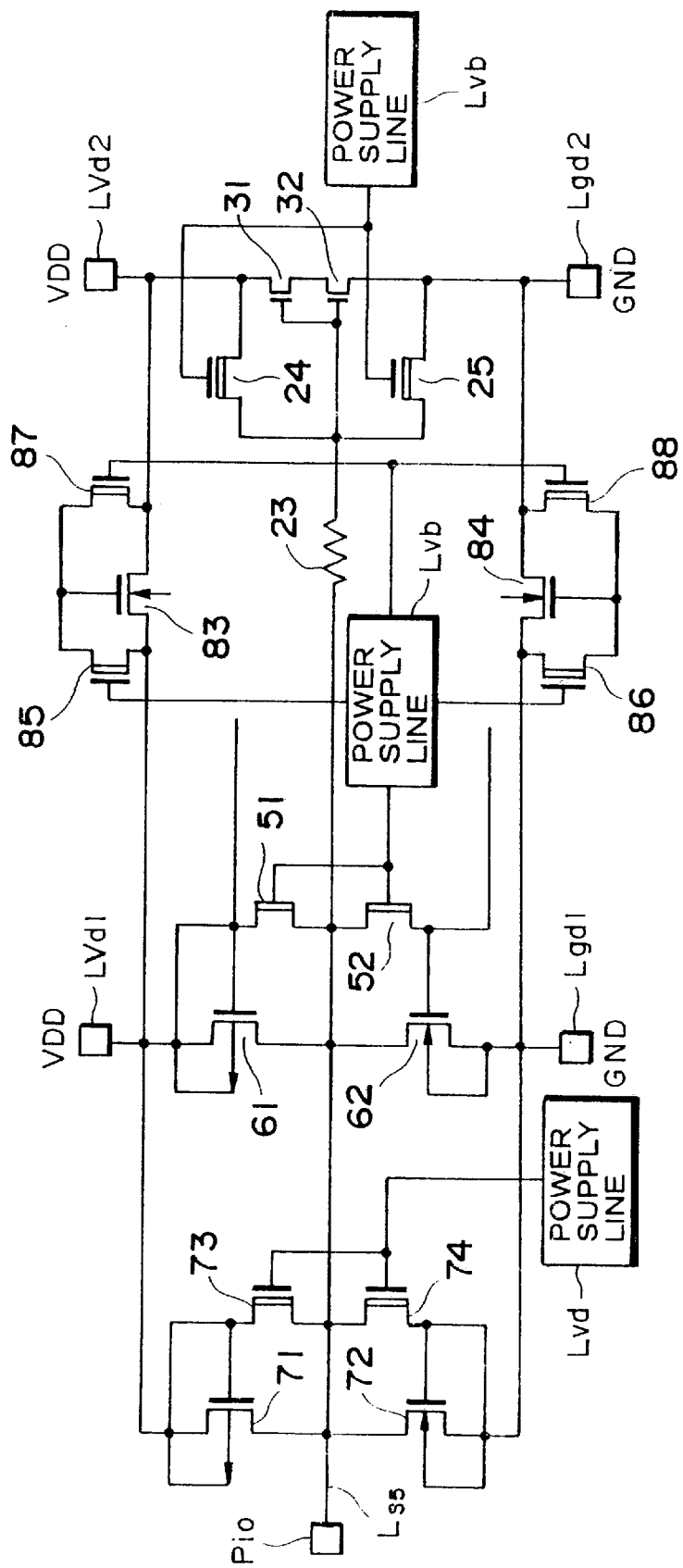
FIG. 15 is a circuit diagram illustrating a ninth embodiment of a protection circuit according to the present invention.

FIG. 15 is a circuit diagram illustrating a ninth embodiment of a protection circuit according to the present invention wherein similar elements to those in FIG. 14 representing the eighth embodiment are denoted by similar reference numerals or symbols.

The feature of this protection circuit is that there are further provided D-NMOS transistors 87 and 88 serving as seventh protection means or protectors. The other parts are similar to those of the eighth embodiment. The D-NMOS transistor 87 is connected between the gate of an NMOS transistor 83 and a voltage supply line Lvd2 and the D-NMOS transistor 88 is connected between the gate of an NMOS transistor 84 and a voltage supply line Lgd2. The gates of the D-NMOS transistors 87 and 88 are connected to a power supply line Lvb.

The protection circuit show in FIG. 15 operates as follows.

When the semiconductor integrated device is inactive, the D-NMOS transistors 85 and 87 are both in an on-state and the D-NMOS transistors 86 and 88 are both in an on-state. As a result, the voltage supply lines Lvd1 and Lvd2 are short-circuited together, and the voltage supply lines Lgd1 and Lgd2 are short-circuited together. In this situation, if an electrostatic surge enters along the signal line $L_{s5}$, it is directly passed to the voltage supply line Lvd2 via the D-NMOS transistors 73, 85, and 87 or to the voltage supply line Lgd2 via the D-NMOS transistors 74, 86, and 88.

On the other hand, when the semiconductor integrated device is active, a voltage VBB equal to the threshold voltage is applied via the power supply line Lvb to the gates of the D-NMOS transistors 73, 74, 85, 86, 87, and 88 so that these D-NMOS transistors behave as insulating elements and thus their conduction is cut off thereby ensuring that the normal operation of the semiconductor integrated device is achieved without encountering adverse effects. The operations of the other parts are similar to those in the eighth embodiment.

In this ninth embodiment, as described above, the D-NMOS transistors 87 and 88 are added to the protection circuit according to the eighth embodiment so as to protect the gate oxide film of the NMOS transistor 83 disposed between the voltage supply lines Lvd1 and Lvd2 and also the gate oxide film of the NMOS transistor 84 disposed between the voltage supply lines Lgd1 and Lgd2 in a more reliable fashion than the eighth embodiment. Furthermore, the D-NMOS transistors 87 and 88 provide paths for passing a surge current thereby protecting, from damage, the gates of the NMOS transistors 83 and 84 and the lines connecting various gates to the voltage supply line Lvd2 or Lgd2.

Tenth Embodiment

Figure 16:
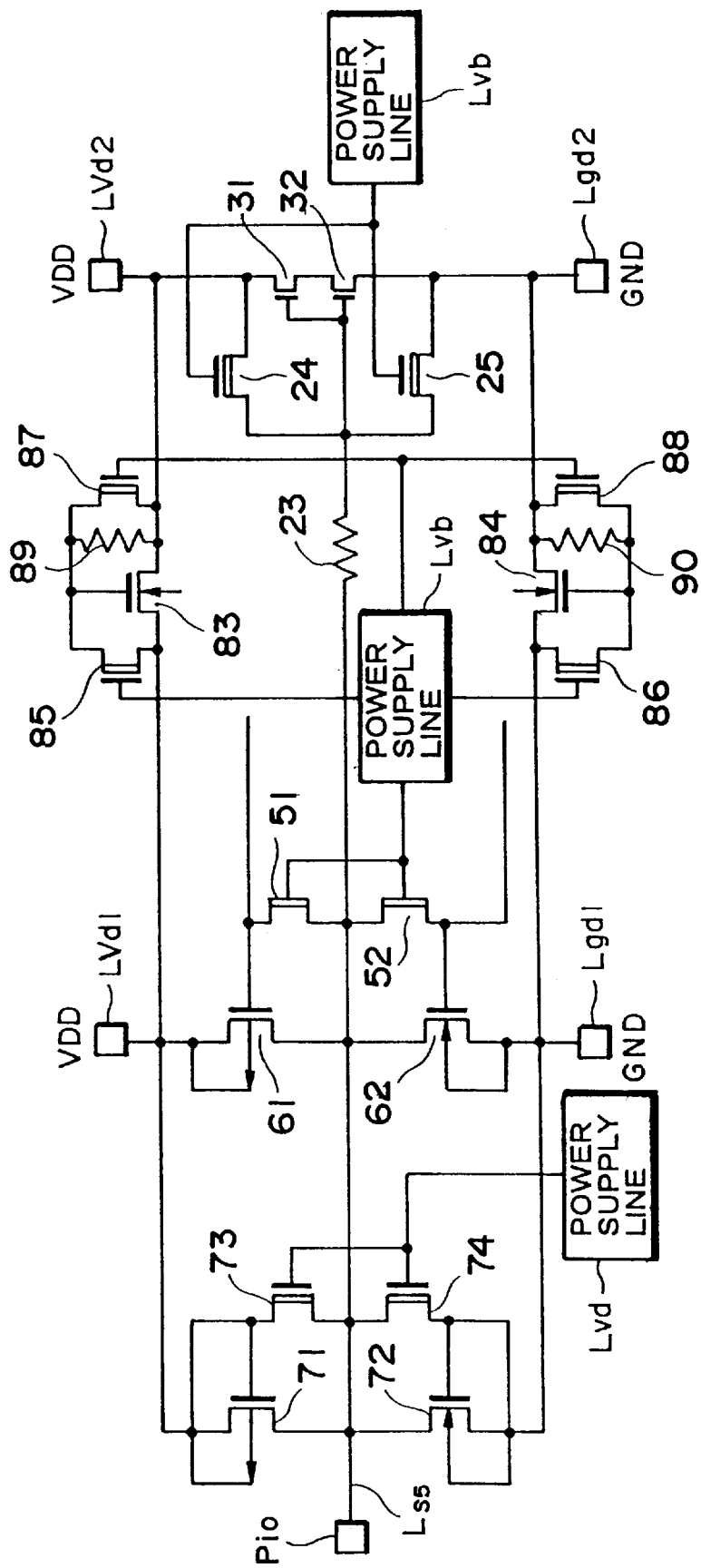
FIG. 16 is a circuit diagram illustrating a tenth embodiment of a protection circuit according to the present invention.

FIG. 16 is a circuit diagram illustrating a protection circuit according to a tenth embodiment of the present invention wherein similar elements to those in FIG. 15 representing the ninth embodiment are denoted by similar reference numerals or symbols.

The feature of this protection circuit is that two resistors 89 and 90 are added to the protection circuit according to the ninth embodiment. The other parts are similar to those of the ninth embodiment shown in FIG. 15. In this tenth embodiment, unlike the ninth embodiment in which the gate and the source of each NMOS transistor 83 and 84 are directly connected to each other, the gate and the source of the NMOS transistor 83 is connected via the resistor 89 and the gate and the source of the NMOS transistor 84 is connected via the resistor 90. The resistance R1 of the resistor 89, the resistance R2 of the D-NMOS transistor 85, and the resistance R3 of the D-NMOS transistor 87 are selected such that equation (3) shown below is satisfied.

$$R1 \times R3/(R1+R3) \geq \tfrac{1}{4} \times R2 \quad (3)$$

Furthermore, the resistance R4 of the resistor 90, the resistance R5 of the D-NMOS transistor 86, and the resistance R6 of the D-NMOS transistor 88 are selected such that equation (4) shown below is satisfied.

$$R4 \times R6/(R4+R6) \geq \tfrac{1}{4} \times R5 \quad (4)$$

The protection circuit show in FIG. 16 operates as follows.

When the semiconductor integrated device is inactive, if a negative electrostatic surge enters along the signal line $L_{s5}$, an electrostatic surge current flows to the voltage supply line Lvd1 via the D-NMOS transistor 73. Herein if equations (3) and (4) are satisfied, the surge current causes the gate voltage of the NMOS transistor 83 to become lower than its threshold voltage, and thus a channel is formed under the gate of the NMOS transistor 83. As a result, the electrostatic surge current is passed as a transistor current to the voltage supply line Lvd2 and absorbed thereby. On the other hand, if a positive electrostatic surge enters along the signal line $L_{s5}$, an electrostatic surge current flows to the voltage supply line Lgd1 via the D-NMOS transistor 74. The surge current causes the gate voltage of the NMOS transistor 84 to become lower than its threshold voltage, and thus a channel is formed under the gate of the NMOS transistor 84. As a result, the electrostatic surge current is passed as a transistor current to the voltage supply line Lgd2 and absorbed thereby.

On the other hand, when the semiconductor integrated device is active, a negative voltage VBB equal to the threshold voltage is applied to the gates of the D-NMOS transistors 85 to 88 so that they behave as insulating elements. Therefore, these transistors do not have adverse effects. For example, when there are provided a plurality of separate power supply terminals or ground terminals for the purpose of handling noise, the purpose is not impaired. The operations of the other parts are similar to those in the ninth embodiment.

In this tenth embodiment, as described above, the resistors 89 and 90 serve to lower or raise the gate voltage of the NMOS transistors 83 and 84 toward the drain voltage. As a result, the NMOS protection transistors 83 and 84 start to operate at a voltage equal to the threshold voltage. Therefore, the drain voltage becomes smaller than that of the protection transistor which starts to operate at the breakdown voltage. As a result, the Joule heat becomes smaller. Thus, the NMOS transistors 83 and 84 can be protected from damage even if the NMOS transistors 83 and 84 have a smaller area than in the ninth embodiment.

Eleventh Embodiment

Figure 17:
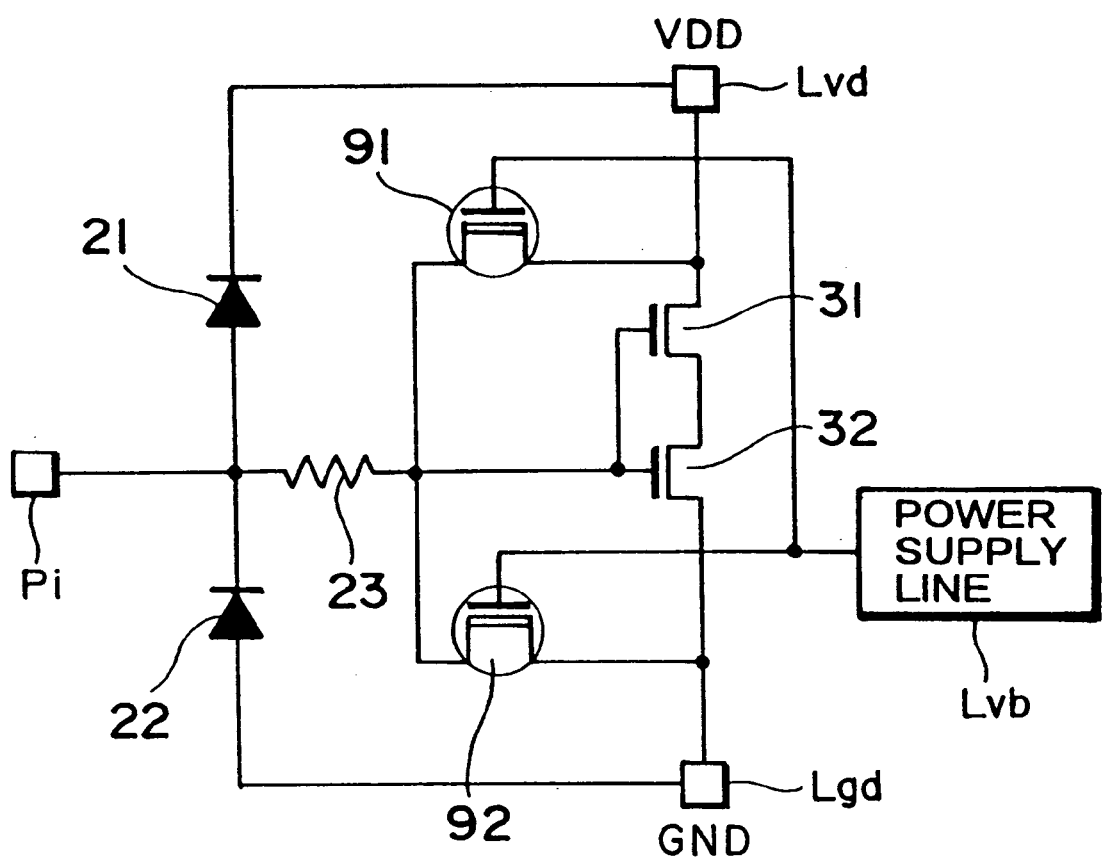
FIG. 17 is a circuit diagram illustrating an eleventh embodiment of a protection circuit according to the present invention.

FIG. 17 is a circuit diagram illustrating an eleventh embodiment of a protection circuit according to the present invention wherein similar elements to those in FIG. 1 representing the first embodiment are denoted by similar reference numerals or symbols.

In the first to tenth embodiments, D-NMOS transistors 24, 25, 51–54, 73–76, 85–86 are employed. Alternatively, a protection circuit may also be constructed using n-type junction field filed effect transistors (hereinafter referred to as n-type JFETs) Herein, a typical example of replacement with JFETs is described. In this specific embodiment, the D-NMOS transistors 24 and 25 in the first embodiment are replaced with n-type JFETs 91 and 92.

The anode of a pn diode 21 is connected to a signal line $L_{s1}$ connected to an input pad Pi and the cathode of the pn diode 21 is connected to a voltage supply line Lvd. The cathode of a pn diode 22 is connected to the signal line $L_{s1}$ and the anode thereof is connected to a voltage supply line Lgd. The signal line $L_{s1}$ connected to the diodes 21 and 22 is also connected to one end of a resistor 23, the other end of which is connected to the drains of the n-type JFETs 91 and 92 serving as protection transistors and also to the gates of a PMOS transistor 31 and the NMOS transistor 32.

The source of the n-type JFET 91 is connected to the voltage supply line Lvd and the source of the n-type JFET 92 is connected to the voltage supply line Lgd. The gates of the n-type JFETs 91 and 92 are connected to the power supply line Lvb.

At the input stage 30 of the internal circuit, the drains of the PMOS transistor 31 and NMOS the transistor 32 are connected to each other, the source of the PMOS transistor 31 is connected to the voltage supply line Lvd, and the source of the NMOS transistor 32 is connected to the voltage supply line Lgd.

Figure 18:
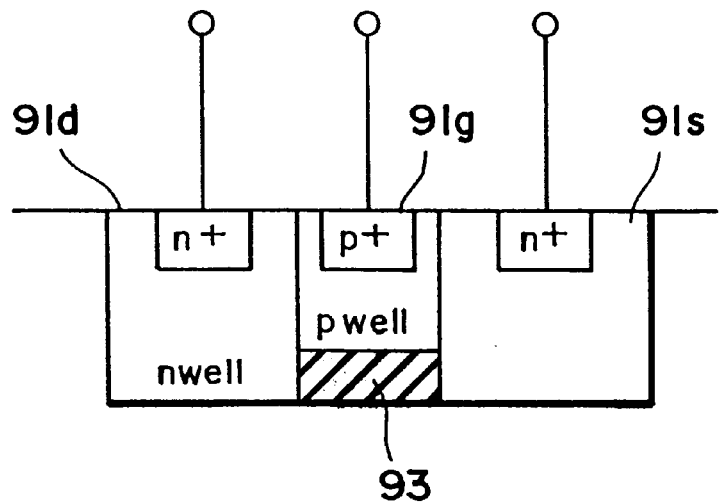
FIG. 18 is a cross-sectional view illustrating the structure of an n-type JFET.
Figure 19:
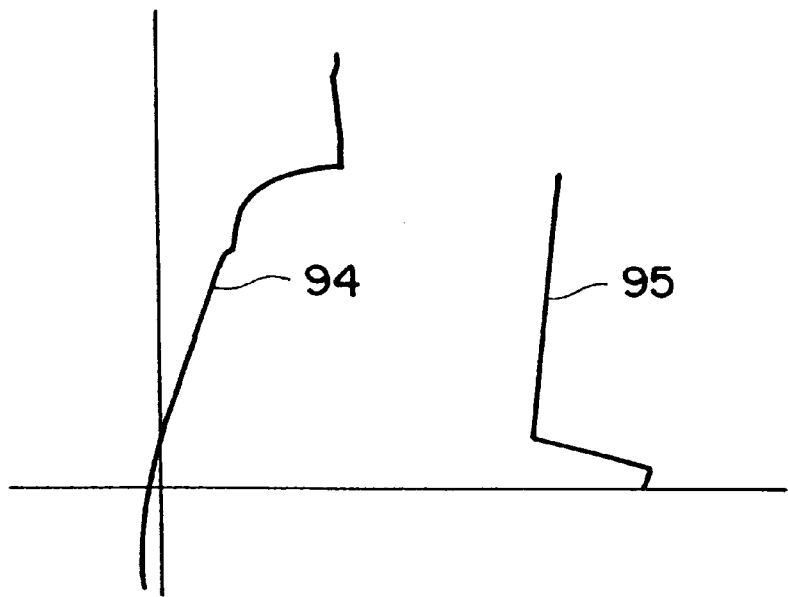
FIG. 19 illustrates the current-voltage characteristic of an n-type JFET.

FIG. 18 is a cross-sectional view illustrating the structure of an n-type JFET, and the current-voltage characteristic of the n-type JFET is shown in FIG. 19. Referring to FIGS. 18 and 19, the operation of the protection circuit shown in FIG. 17 is described below.

For example, the n-type JFET 91 includes, as shown in FIG. 18, an n-type source 91s, an n-type drain 91d, and a channel 93 made up of a low-concentration n-type impurity region which provides electric conduction between the source 91s and the drain 91d. The n-type JFET 91 further includes a gate 91g made up of a p-type impurity region on the low-concentration n-type impurity region. When the semiconductor integrated device is inactive, the n-type JFET 91 acts as a resistor as represented by a characteristic curve 94 in FIG. 19. If a negative voltage lower than the threshold voltage is applied to the gate 91g of the n-type JFET, the low-concentration n-type impurity region is depleted and the channel 93 disappears. Once the channel 93 disappears, the resistance between the source 91s and the drain 91d becomes extremely high as represented by a characteristic curve 95 in FIG. 19 and thus the source 91s and the drain 91d are substantially isolated from each other. The n-type JFET 92 operates in a similar manner.

Thus, as in the first embodiment, when the semiconductor integrated device is inactive, the n-type JFET 91 acts as a resistor and thus the signal line $L_{s1}$ and the source of the PMOS transistor 31 are short-circuited via the n-type JFET 91. Similarly, the signal line $L_{s1}$ and the source of the NMOS transistor 32 are short-circuited via the n-type JFET 92. Therefore, even if a positive or negative electrostatic surge is applied to the signal line $L_{s1}$, the electrostatic surge is passed to the voltage supply line Lvd or Lgd via the diode 21 or 22 and absorbed thereby. Furthermore, no voltage is applied across the gate oxide film located between the gate and the source diffusion layer of the PMOS transistor 31 and the NMOS transistor 32. As a result, the gate oxide film is effectively prevented from being damaged regardless of the response speed of the diode 21 or 22 against the surge.

The respective D-NMOS transistors used in the protection circuit according to any of second to tenth embodiments may be replaced with n-type JFETs to achieve similar effects.

In this eleventh embodiment, as described above, the D-NMOS transistors used in the protection circuit according to any of first to tenth embodiments are replaced with n-type JFETs so as to achieve effects and advantages similar to those achieved in the first to tenth embodiments. Unlike the D-NMOS transistors, n-type JFETs have no gate oxide film. Therefore, the protection of the gate oxide film is no longer required.

Twelfth Embodiment

Figure 20:
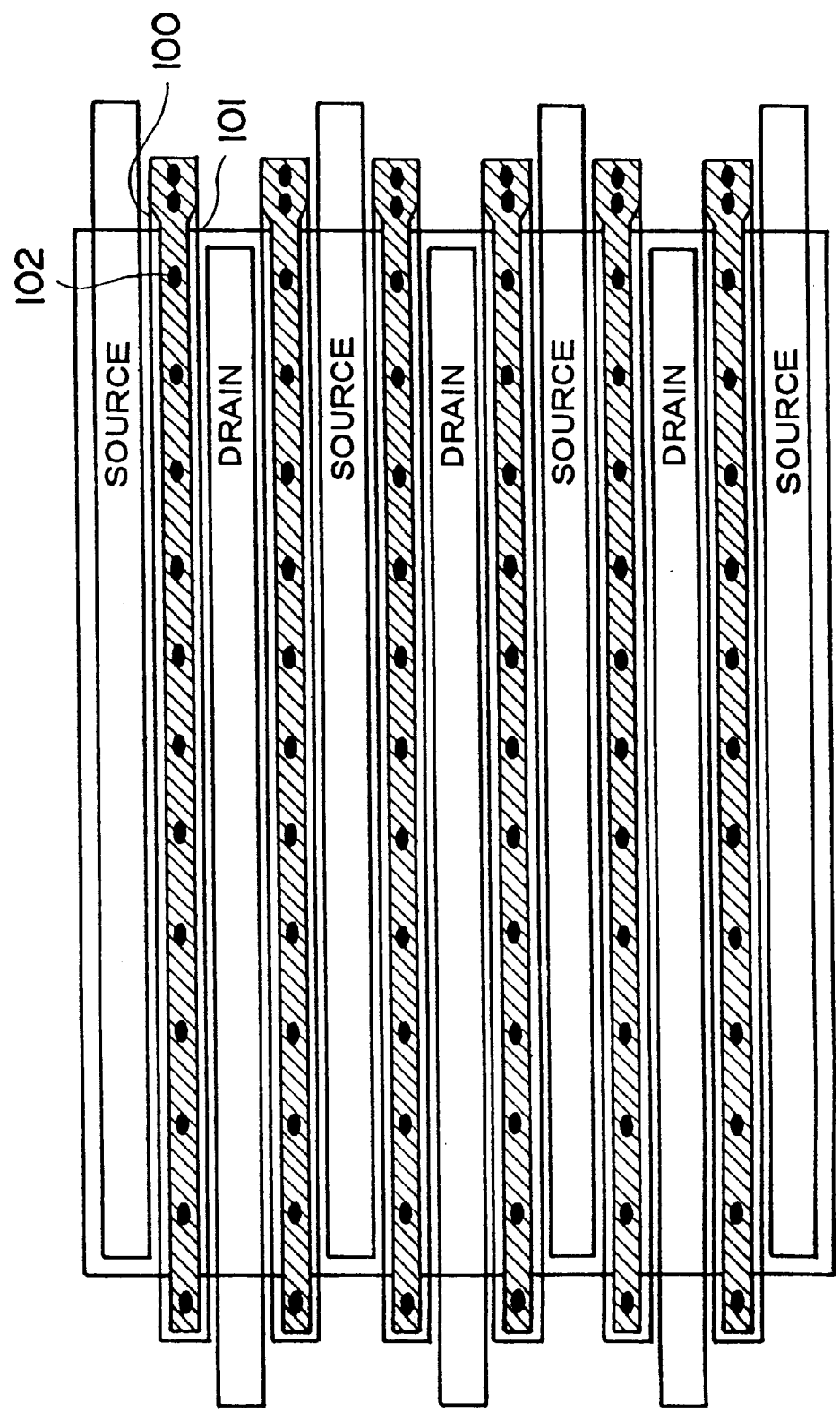
FIG. 20 is a circuit diagram illustrating a twelfth embodiment of a protection circuit according to the present invention.

FIG. 20 is a plan view of a transistor according to a twelfth embodiment.

The transistor shown in FIG. 20 may be employed for any of the D-NMOS transistors 51–54, 73–76, and 85–88 used in the fourth to eleventh embodiments. When these D-NMOS transistors are replaced with n-type JFETs, the transistor shown in FIG. 20 may be employed for the PMOS protection transistor 71 and the NMOS protection transistors 72, 83, and 84 whose gate is connected to the corresponding n-type JFET.

In any transistor 71, 72, 83, and 84, the gate electrode disposed in each space between the adjacent drain and source is made up of a polysilicon gate pattern 100. An aluminum interconnection 101 is formed on each gate pattern 100 so that the aluminum interconnection 101 is maintained at the same voltage as that of gate electrode. The pattern 100 is connected to the aluminum interconnection 101 via contact holes 102 formed at fixed intervals.

The polysilicon used as the material to form the gate electrode has a sheet resistance in the range of a few $\Omega/\square$ to 10 $\Omega/\square$ or slightly higher. This means that if the metal interconnection 101 were not provided, the pattern 100 would have a rather large resistance, such as a few hundreds $\Omega$ as measured between the two ends in the longitudinal direction. If one end of the gate electrode of the protection transistor having such a structure were connected to any of the D-NMOS transistor 51–54, 73–76, and 85–88, the other end of the gate electrode would have a voltage difference due to the resistance of few hundreds $\Omega$. As a result, the gate electrode and the drain diffusion layer would not be short-circuited to a sufficient extent and thus there would be a possibility that the gate oxide film might be damaged.

The above problem can be avoided by connecting the gate electrode to the metal interconnection 101 via the contact holes formed at fixed intervals thereby achieving an equal voltage over the entire gate electrode in the longitudinal direction. This ensures that the gate oxide films of the PMOS transistor 71 and the NMOS transistor 72, 83, and 84 in the fourth to eleventh embodiments are protected from damage.

Thirteenth Embodiment

Figure 21:
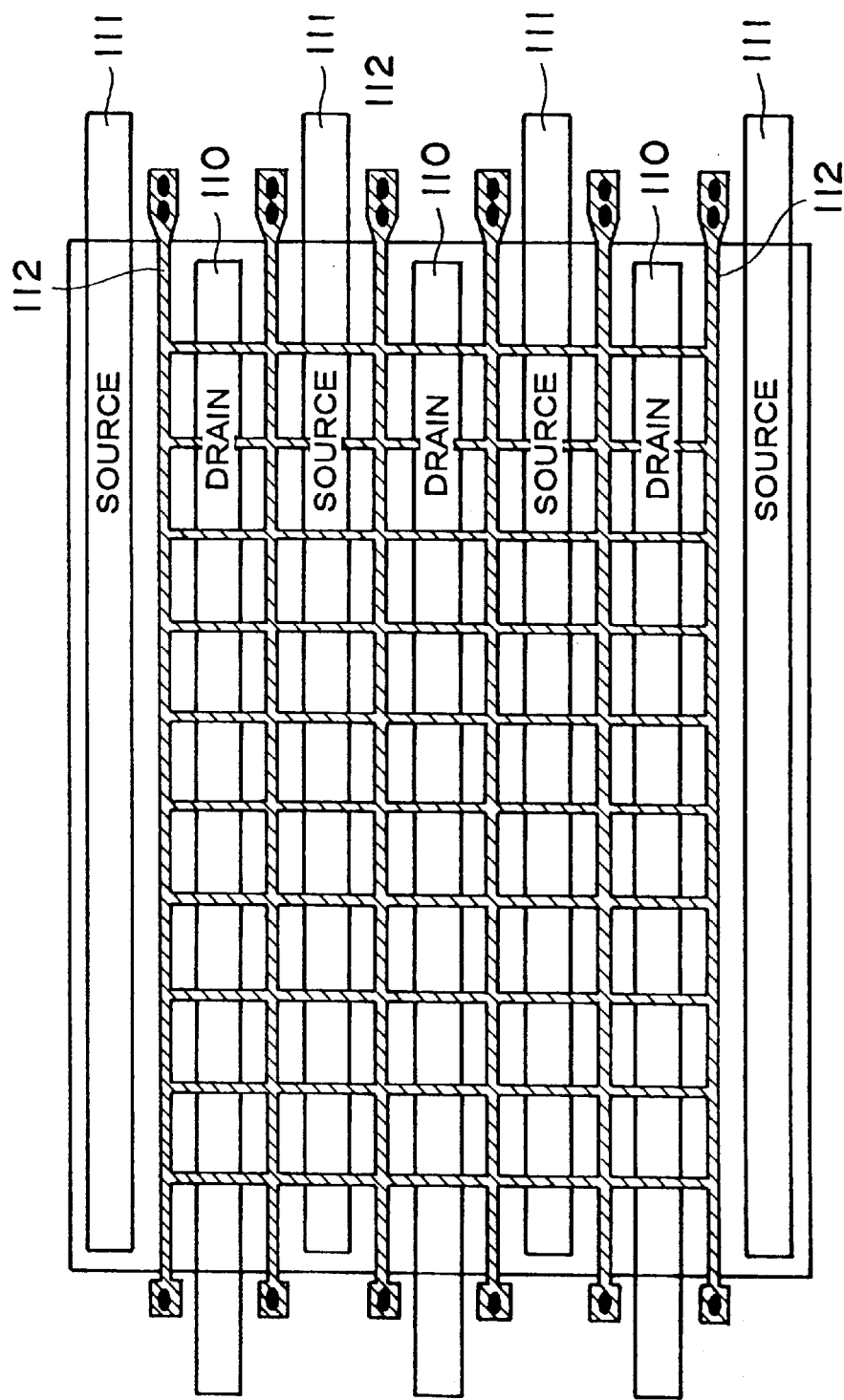
FIG. 21 is a circuit diagram illustrating a thirteenth embodiment of a protection circuit according to the present invention.

FIG. 21 is a plan view of a transistor according to a thirteenth embodiment.

The transistor shown in FIG. 21 may be employed for any of the D-NMOS transistors 51–54, 73–76, and 85–88 used in the fourth to eleventh embodiments. When these D-NMOS transistors are replaced with n-type JFETs, the transistor shown in FIG. 21 may be employed for the PMOS protection transistor 71 or any of the NMOS protection transistors 72, 83, and 84 whose gate is connected to the corresponding n-type JFET. This transistor includes a plurality of drain electrodes 110 and a plurality of source electrodes wherein both drain and source electrodes are made of metal, and drains and sources are alternately disposed. A plurality of polysilicon patterns 112 are formed in each space between the adjacent drain electrode 110 and source electrode 111. The plurality of polysilicon patterns 112 serve as the gate electrode wherein these polysilicon patterns 112 are connected to each other via polysilicon into a ladder or lattice form.

If the transistor structure shown in FIG. 21 in which the patterns are connected to each other into a ladder or lattice form is employed for the PMOS transistor 71 and the NMOS transistors 72, 83, and 84, then, as in the twelfth embodiment, the voltage difference between the two end of the gate electrode is minimized and thus the gate oxide film can be effectively protected from damage. In this thirteenth embodiment, unlike the twelfth embodiment, the reduction in the resistance of the gate electrode along the longitudinal direction is achieved using only polysilicon. That is, the metal interconnections over the patterns 112 are not necessary and thus the cost of the semiconductor integrated device can be reduced.

Although the present invention has been described with reference to specific embodiments, the invention is not limited to these embodiments, but various modification and change are possible.

1. Although in the first embodiment, the diodes 21 and 22 are used as the protection devices, the diodes 21 and 22 may be replaced with the PMOS protection transistor 71 and the NMOS protection transistor 72 employed in the fourth embodiment.

2. In the protection circuit according to any of the first to tenth embodiments, each protection means or protector is realized using D-NMOS transistors 51–54, 73–76, or 85–88. On the other hand, in the eleventh embodiment, an n-type JFET is employed to realize the protector. These protection circuits are suitable for use with a DRAM circuit. A DRAM includes a plurality of memory cells, an internal circuit for get access to these memory cells, and a substrate voltage generating circuit for generating a substrate voltage VBB which can used as the second power supply voltage. Thus, if this substrate voltage generating circuit is used, no additional step-down circuit is required. Furthermore, the DRAM includes an internal step-up circuit used to read data written in the memory cells. This step-up circuit can be used to produce a protection circuit similar to that according to any of the first to tenth embodiments.

In this case, the D-NMOS transistors 51–54, 73–76, 85–88 should be replaced with depletion type PMOS transistors or p-channel junction field effect transistors.

As can be understood from the above description, the present invention has various advantages. In the electrostatic damage protection circuit according to an aspect of the invention, there is provided a first protector whereby the gate electrode and the second electrode of the input transistor are short-circuited when the semiconductor integrated device is inactive thereby ensuring that no high voltage is applied across the gate oxide film of the input transistor thus preventing the gate oxide film from being damaged.

According to another aspect of the invention, there is provided the first protector whereby the gate electrode and the first electrode of the output transistor are short-circuited only when the semiconductor integrated device is inactive thereby ensuring that no high voltage is applied across the gate oxide film of the output transistor thus preventing the gate oxide film from being damaged.

According to still another aspect of the invention, there is provided a third protector whereby the gate electrode and the first electrode of the protection transistor is short-circuited when the semiconductor integrated device is inactive thereby ensuring that no high voltage is applied across the gate oxide film of the protection transistor thus preventing the gate oxide film from being damaged.

According to still another aspect of the invention, there is provided a fifth protector whereby the plurality of separate voltage supply lines are short-circuited when the semiconductor integrated device is inactive thereby ensuring that the gate oxide films of the transistors connected to the voltage supply lines are prevented from being damaged.

According to still another aspect of the invention, there is provided sixth protector whereby the gate electrode and the first electrode of the protection transistor connected between the plurality of voltage supply lines are short-circuited thereby ensuring that the gate oxide film of the protection transistor is protected from damage.

Furthermore, the protection circuit according to the invention can be used in a DRAM circuit. The DRAM circuit includes a circuit for generating a second power supply voltage, which can be used in the protection circuit. Thus, an additional circuit for generating the second power supply voltage is not required. This allows to realize an internal circuit with high reliability.

What is claimed is:

1. An electrostatic damage protection circuit for use in an integrated circuit device having a signal pad, a circuit to be protected, first and second power supply lines for supplying power to the circuit to be protected, and signal path means for connecting the signal pad to the circuit to be protected, said electrostatic damage protection circuit comprising:

first and second protection elements that are connected to the signal path means, the first protection element additionally being connected to the first power supply line and the second protection element additionally being connected to the second power supply line, the first protection element becoming conductive if the signal pad receives an electrostatic voltage that is higher than a predetermined positive magnitude and the second protection element becoming conductive if the signal pad receives an electrostatic voltage that is lower than a predetermined negative magnitude;

a first protector, connected to the first protection element, for preventing breakdown of the first protection element due to an excessive reverse voltage when the second protection element is conductive, the first protector comprising a first depletion-type MOS transistor having a gate electrode that receives a voltage that is different from voltages on either of the first and second power supply lines; and a second protector, connected to the second protection element, for preventing breakdown of the second protection element due to an excessive reverse voltage when the first protection element is conductive, the second protector comprising a second depletion-type MOS transistor having a gate electrode that receives said voltage that is different from voltages on either of the first and second power supply lines, wherein the first and second depletion-type MOS transistors are cut-off during normal operation of the integrated circuit device.

2. An electrostatic damage protection circuit according to claim 1, wherein the circuit to be protected is an input circuit having an input transistor with a gate electrode for inputting an input signal received from the signal pad, wherein the signal path means comprises a resistor connected between the signal pad and the gate electrode of the input transistor for delaying an input signal, and wherein the first depletion-type MOS transistor has an additional electrode that is connected to the gate electrode of the input transistor.

3. An electrostatic damage protection circuit according to claim 1, wherein the circuit to be protected is an output circuit having an output transistor with a gate electrode that receives a signal, a first electrode that is connected to the signal path means, a second electrode, and means for connecting the second electrode to the first power supply line, wherein a third depletion-type MOS transistor is connected between the first electrode and the gate electrode of the output transistor.

4. An electrostatic damage protection circuit according to claim 3, further comprising another depletion-type MOS transistor that is connected between the gate electrode of the output transistor and the first power supply line, the another depletion-type MOS transistor having a gate electrode that receives said voltage that is different from voltages on either of the first and second power supply lines.

5. An electrostatic damage protection circuit according to claim 1, wherein the first protection element is a protection transistor with a gate electrode, a first electrode that is connected to the signal path means, and a second electrode that is connected to the first power supply line, and wherein the first depletion-type MOS transistor is connected between the gate electrode and the first electrode of the protection transistor.

6. An electrostatic damage protection circuit according to claim 5, further comprising an additional depletion-type MOS transistor that is connected between the gate electrode of the protection transistor and the first power supply line.

7. An electrostatic damage protection circuit according to claim 6, further comprising a resistor connected between the gate electrode of the protection transistor and the first power supply line, wherein if the resistance of the resistor is denoted by R1, the resistance of a short-circuited path provided by the first depletion-type MOS transistor is denoted by R2, and the resistance of a short-circuited path provided by the additional depletion-type MOS transistor is denoted by R3, the resistances R1, R2, and R3 are set such that the combined resistance of R1 and R3 is equal to or greater than one fourth the resistance R2.

8. An electrostatic damage protection circuit according to claim 2, wherein there is provided an electrically conductive metal interconnection above the gate electrode of the first depletion-type MOS transistor, and wherein there are provided contact holes at fixed intervals between the gate electrode of the first depletion-type MOS transistor and the metal interconnection whereby the gate electrode of the first depletion-type MOS transistor and the metal interconnection are connected to each other via the contact holes.

9. An electrostatic damage protection circuit according to claim 2, wherein the first depletion-type MOS transistor includes:
   a plurality of first electrodes and a plurality of second electrodes formed at predetermined intervals on a substrate, the first electrodes and second electrodes being alternately disposed;
   a plurality of gate patterns formed above spaces between the first and second electrodes, each gate pattern being located above a corresponding space; and
   a connecting pattern formed with the same material as the plurality of gate patterns, the plurality of gate patterns being connected to one another into a ladder form or into a lattice form.

10. An integrated circuit device having an electrostatic damage protection circuit according to claim 2, wherein the circuit to be protected is a dynamic random access memory comprising: a plurality of memory cells; means for accessing the plurality of memory cells; and a voltage generating circuit for generating said voltage that is different from voltages on either of the first and second power supply lines.

11. An electrostatic damage protection circuit according to claim 1, wherein the circuit to be protected is a first circuit, wherein the integrated circuit device additionally includes a second circuit to be protected, and third and fourth power supply lines for supplying power to the second circuit to be protected, and wherein the electrostatic damage protection circuit further comprises selective connection means for electrically connecting the first and third power supply lines and for electrically connecting the second and fourth power supply lines unless the selective connection means receives said voltage that is different from voltages on either of the first and second power supply lines.

12. An electrostatic damage protection circuit according to claim 11, wherein the selective connection means comprises a plurality of depletion-type MOS transistors.

13. An electrostatic damage protection circuit according to claim 11, wherein the selective connection means comprises
   a protection transistor with first and second electrodes that are respectively connected to the first and third supply lines, and a gate electrode that is connected to either the first or second electrode, and
   a depletion-type MOS transistor connected between the gate electrode and either the second or first electrode of the protection transistor, the depletion-type MOS transistor having a gate that receives said voltage that is different from voltages on either of the first and second power supply lines.

14. An electrostatic damage protection circuit according to claim 13, wherein the selective connection means further comprises another depletion-type MOS transistor that is connected between the gate electrode of the protection transistor and either the first or second electrode of the protection transistor.

15. An electrostatic damage protection circuit according to claim 14, wherein the selective connection means further comprises a resistor connected to the gate electrode of the protection transistor.

16. An electrostatic damage protection circuit according to claim 2, wherein the first and second depletion-type MOS transistors are n-channel depletion-type MOS transistors.

17. An electrostatic damage protection circuit according to claim 2, wherein the first and second depletion-type MOS transistors are p-channel depletion-type MOS transistors.

18. An electrostatic damage protection circuit for use in an integrated circuit device having a signal pad, a circuit to be protected, first and second power supply lines for supplying power to the circuit to be protected, and signal path means for connecting the signal pad to the circuit to be protected, said electrostatic damage protection circuit comprising:
   a first depletion-type MOS transistor having an electrode that is connected to the signal path means, another electrode that is connected to the circuit to be protected, and a gate electrode that receives a voltage that is different from voltages on either of the first and second power supply lines; and
   a second depletion-type MOS transistor having an electrode that is connected to the signal path means, another electrode that is connected to the circuit to be protected, and a gate electrode that receives said voltage that is different from voltages on either of the first and second power supply lines.

19. An electrostatic damage protection circuit according to claim 18, wherein the circuit to be protected is a CMOS circuit having an output stage with first and second MOS output transistors, the first output transistor being connected between the first power supply line and the signal path means and the second output transistor being connected between the second power supply line and the signal path means, the first output transistor having a gate electrode to which the another electrode of the first depletion-type MOS transistor is connected and the second output transistor having a gate electrode to which the another electrode of the second depletion-type MOS transistor is connected.

20. An electrostatic damage protection circuit according to claim 19, wherein the first power supply line carries a positive voltage, the second power supply line carries a zero voltage, and said voltage that is different from voltages on either of the first and second power supply lines is a negative voltage.

21. An electrostatic damage protection circuit according to claim 19, wherein the first output transistor is a PMOS transistor, the second output transistor is an NMOS transistor, the first depletion-type MOS transistor is an NMOS transistor, and the second depletion-type transistor is an NMOS transistor.

22. An electrostatic damage protection circuit according to claim 19, further comprising a third depletion-type MOS transistor having an electrode that is connected to the first power supply line, another electrode that is connected to the another electrode of the first depletion-type MOS transistor, and a gate electrode that receives said voltage that is different from voltages on either of the first and second power supply lines, and a fourth depletion-type MOS transistor having an electrode that is connected to the second power supply line, another electrode that is connected to the another electrode of the second depletion-type MOS transistor, and a gate electrode that receives said voltage that is different from voltages on either of said first and second power supply lines.

* * * * *